(12) United States Patent  (10) Patent No.: US 8,690,136 B2
Kelekar  (45) Date of Patent: Apr. 8, 2014

(54) INTERNAL RINSING IN TOUCHLESS INTERSTITIAL PROCESSING

(75) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 89 days.

(21) Appl. No.: 13/306,821

(22) Filed: Nov. 29, 2011

(65) Prior Publication Data

US 2013/0134130 A1 May 30, 2013

(51) Int. Cl.
*B25B 11/00* (2006.01)

(52) U.S. Cl.
USPC ............................................ 269/21; 269/903

(58) Field of Classification Search
USPC ................. 269/21, 289 R, 309–310
See application file for complete search history.

(56) References Cited

U.S. PATENT DOCUMENTS

| | | |
|---|---|---|
| 4,477,287 A | 10/1984 | Kush et al. |
| 6,005,226 A | 12/1999 | Aschner et al. |
| 6,142,017 A | 11/2000 | Glassey |
| 6,357,907 B1 | 3/2002 | Cleveland et al. |
| 6,389,677 B1 * | 5/2002 | Lenz ................................ 29/559 |
| 6,601,888 B2 | 8/2003 | Mcilwraith et al. |
| 6,764,386 B2 | 7/2004 | Uziel |
| 7,098,045 B2 | 8/2006 | Noji et al. |
| 7,456,930 B2 | 11/2008 | Hazelton et al. |
| 7,607,647 B2 * | 10/2009 | Zhao et al. ....................... 269/21 |
| 2007/0222131 A1* | 9/2007 | Fukumoto et al. ............... 269/21 |
| 2010/0244350 A1* | 9/2010 | Fujisato et al. ........... 269/289 R |
| 2010/0300492 A1 | 12/2010 | Magni et al. |
| 2013/0134130 A1* | 5/2013 | Kelekar ............................. 216/83 |

* cited by examiner

*Primary Examiner* — Lee D Wilson

(57) ABSTRACT

Methods and apparatuses are disclosed for rinsing the interface area of a liquid and air boundary after a substrate cleaning process using gas barrier. In some embodiments, a protective chuck having an inner gas ring and an outer liquid ring can be used to clean the area under the edge of the protective chuck. A gas flowing outward from the gas ring can enable a liquid to flow outward from the liquid ring, rinsing the outer portion of the protective chuck. The interface rinsing process can enable combinatorial processing of a substrate, providing multiple isolated processing regions on a single substrate with different material and processing conditions.

11 Claims, 25 Drawing Sheets

INTERNAL RINSING IN TOUCHLESS INTERSTITIAL PROCESSING

This application is related to U.S. application Ser. No. 13/081,914 filed on Apr. 7, 2011 and entitled "No-Contact Wet Processing Tool with Site Isolation", to U.S. application Ser. No. 13/192,677 filed on Jul. 28, 2011 entitled "No-Contact Wet Processing Tool with Fluid Barrier" and to U.S. application Ser. No. 13/194,439 filed on Jul. 29, 2011 entitled "No-Contact Wet Processing Tool with Liquid Barrier", to U.S. application Ser. No. 13/272,041 filed on Oct. 12, 2011 entitled "Gas Barrier with Vent Ring for Protecting a Surface Region from Liquid", to U.S. application Ser. No. 13/272,041 filed on Oct. 12, 2011 entitled "Gas Barrier with Vent Ring for Protecting a Surface Region from Liquid", to U.S. application Ser. No. 13/306,767 filed on Nov. 29, 2011 entitled "Dynamic Gas Flow Control of Touchless Interstitial Cells" and to U.S. application Ser. No. 13/337,374 filed on Dec. 27, 2011 entitled "Touchless Site Isolation Using Air Bearing", the disclosures of which are incorporated by reference herein.

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, multiple site isolated regions on a substrate surface can be formed by sealing different regions of the surface, isolating the surface regions from each other. The surface sealing can generate particles, which requires subsequent substrate cleaning. Therefore there is a need for non-contact isolation of surface regions on a substrate surface.

SUMMARY OF THE DESCRIPTION

In some embodiments, the present invention discloses systems and methods for isolating a surface region of a substrate during a wet processing of the remaining surface without contacting the surface. For example, the substrate surface is covered with a fluid to clean or wet etch the substrate surface. The present invention forms a gas layer on a surface region of the substrate, protecting the surface region from being similarly processed by the fluid.

In some embodiments, the present invention discloses a method to rinse the region protected by the gas layer, especially the gas/fluid interface area, after the fluid processing. An exemplary method comprises a combination of gas and fluid flow passing the interface area, after draining the processing fluid. The gas flow is preferably disposed inside the liquid flow, helping to push the liquid toward the interface area, rinsing any remaining residues.

In some embodiments, the present invention discloses a chuck configured to form a gas layer with a region of a substrate surface. The gas layer forms a pressurized region, blocking an outside fluid. The chuck can be further configured to generate a fluid flow toward the outer edges of the substrate region, rinsing any residues remained after the outside fluid is removed.

In some embodiments, an exemplary chuck comprises a bottom surface having three terminated conduits. The first conduit can comprise a plurality of outlets disposed in a periphery of a recessed area of the bottom surface. The second conduit can comprise multiple outlets disposed in a recessed ring surrounding the outlets of the first conduit. The third conduit can comprise a ring outlet surrounding the multiple outlets of the second conduit. For protecting a surface region, the first and third conduits are coupled to a gas source and a vent exhaust, respectively, forming a protective gas layer between the chuck and the surface region. For rinsing the surface region, the first and second conduits are coupled to a gas source and a fluid source, respectively, forming a rinsing fluid flow toward the edges of the surface region.

In some embodiments, the present invention discloses a high productivity combinatorial system, comprising a substrate support and a plurality of chucks for processing multiple site isolated regions on a substrate disposed on the substrate support.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for isolating a surface region of a substrate during a wet processing of the remaining surface without contacting the surface. The present non-contact isolation can reduce or eliminate particulates or debris, especially at the boundary of the protected region. In some embodiments, the present invention discloses methods and systems for use in high productivity combinatorial processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
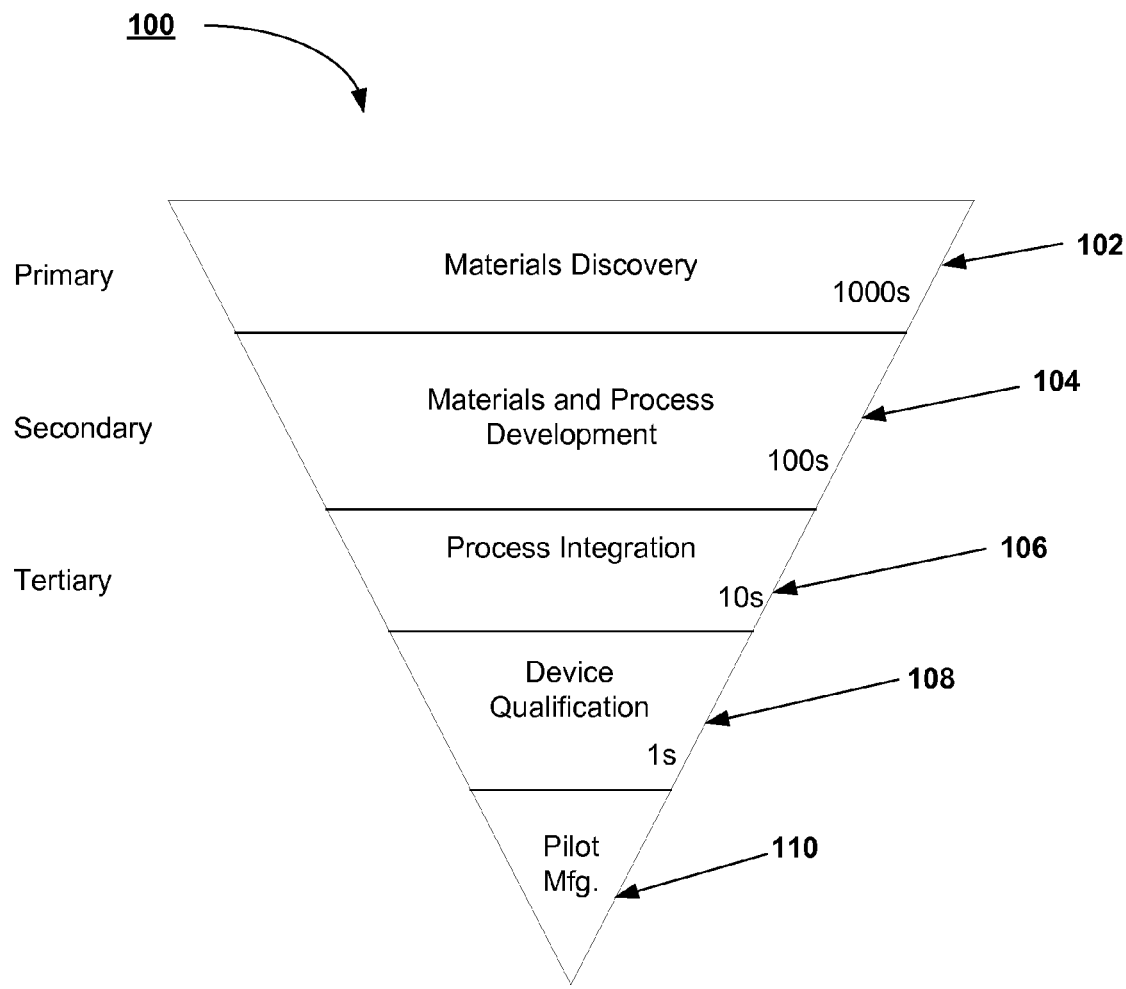
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
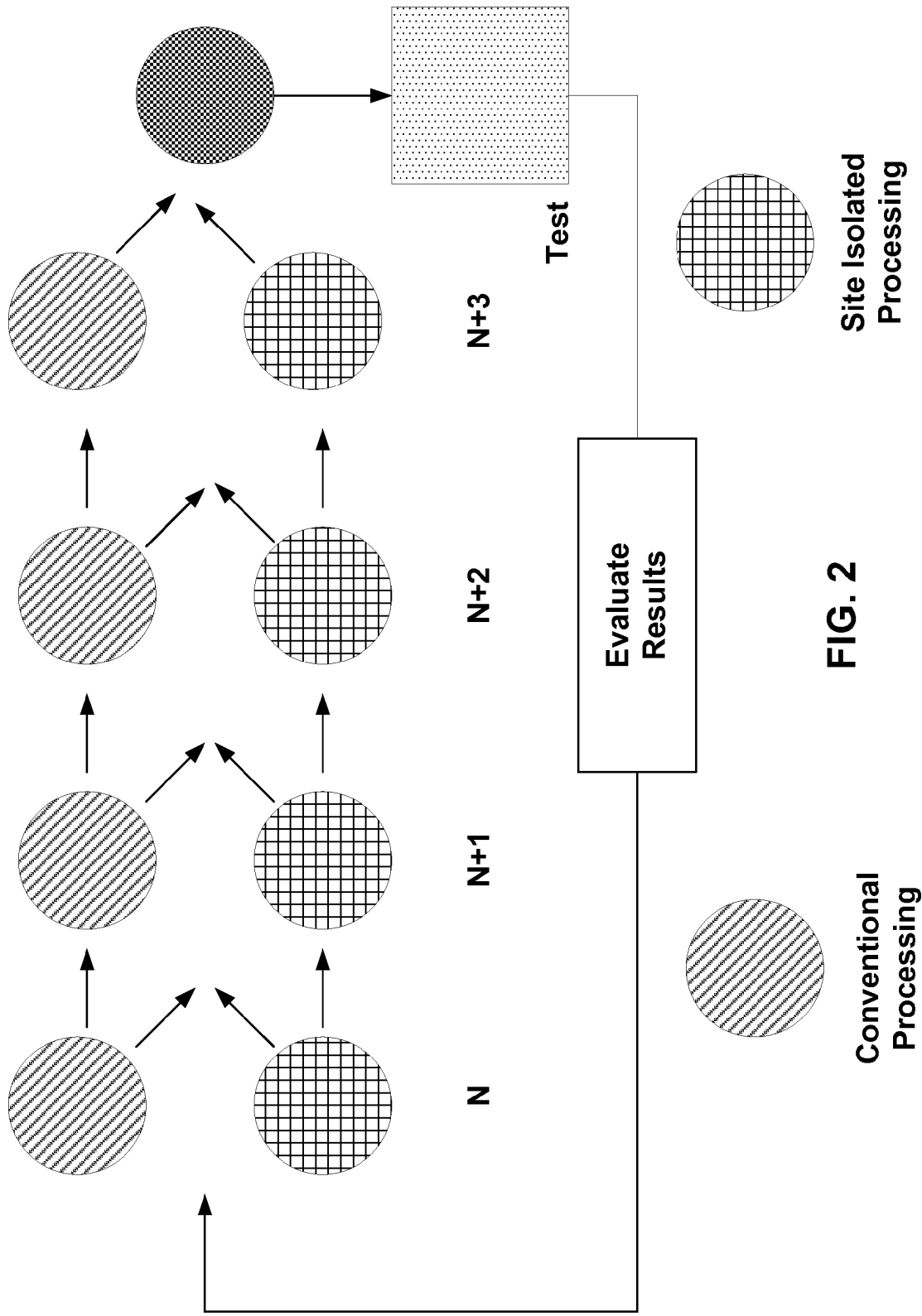
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
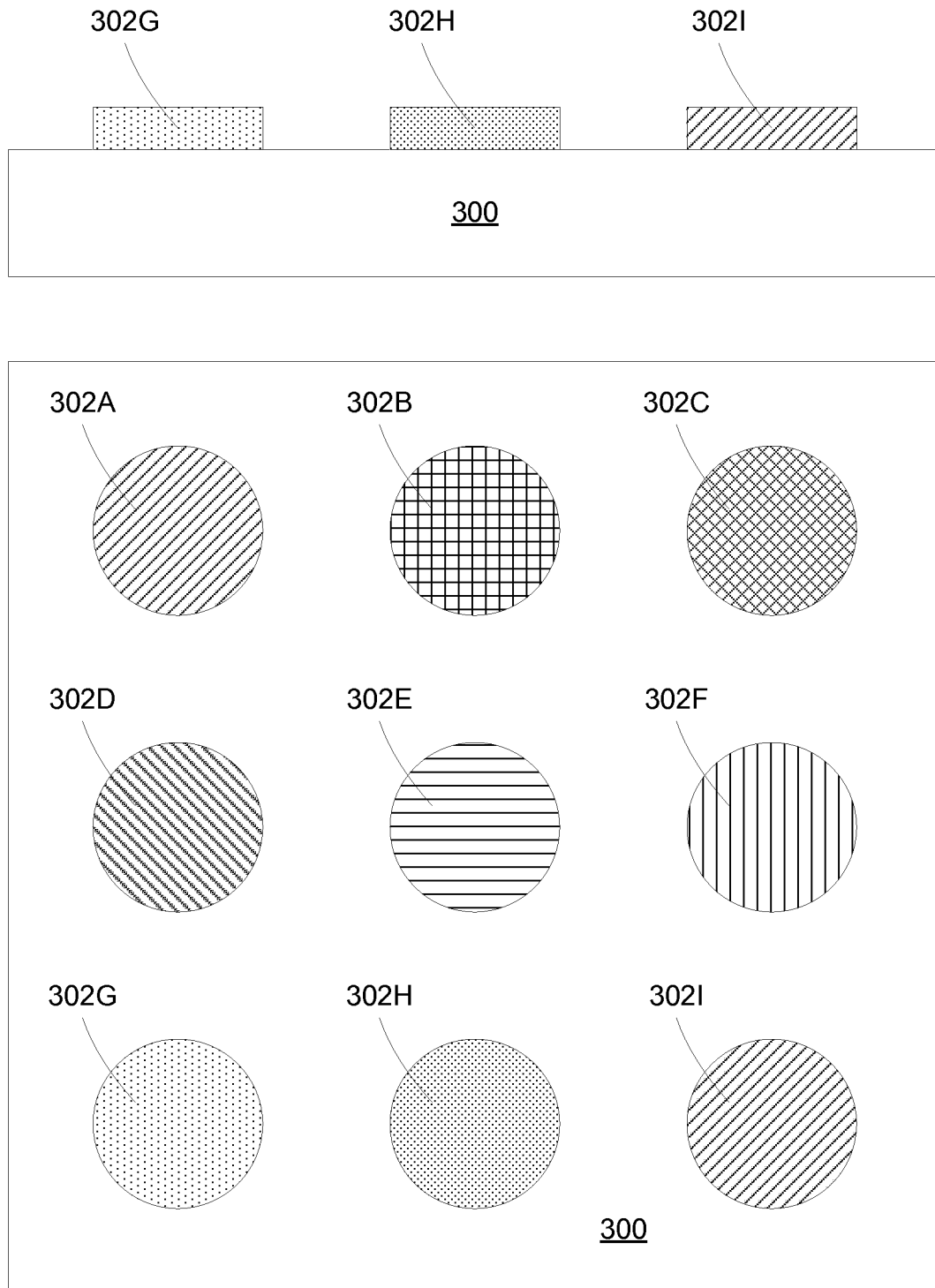
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302A-302I, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302G-302I. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
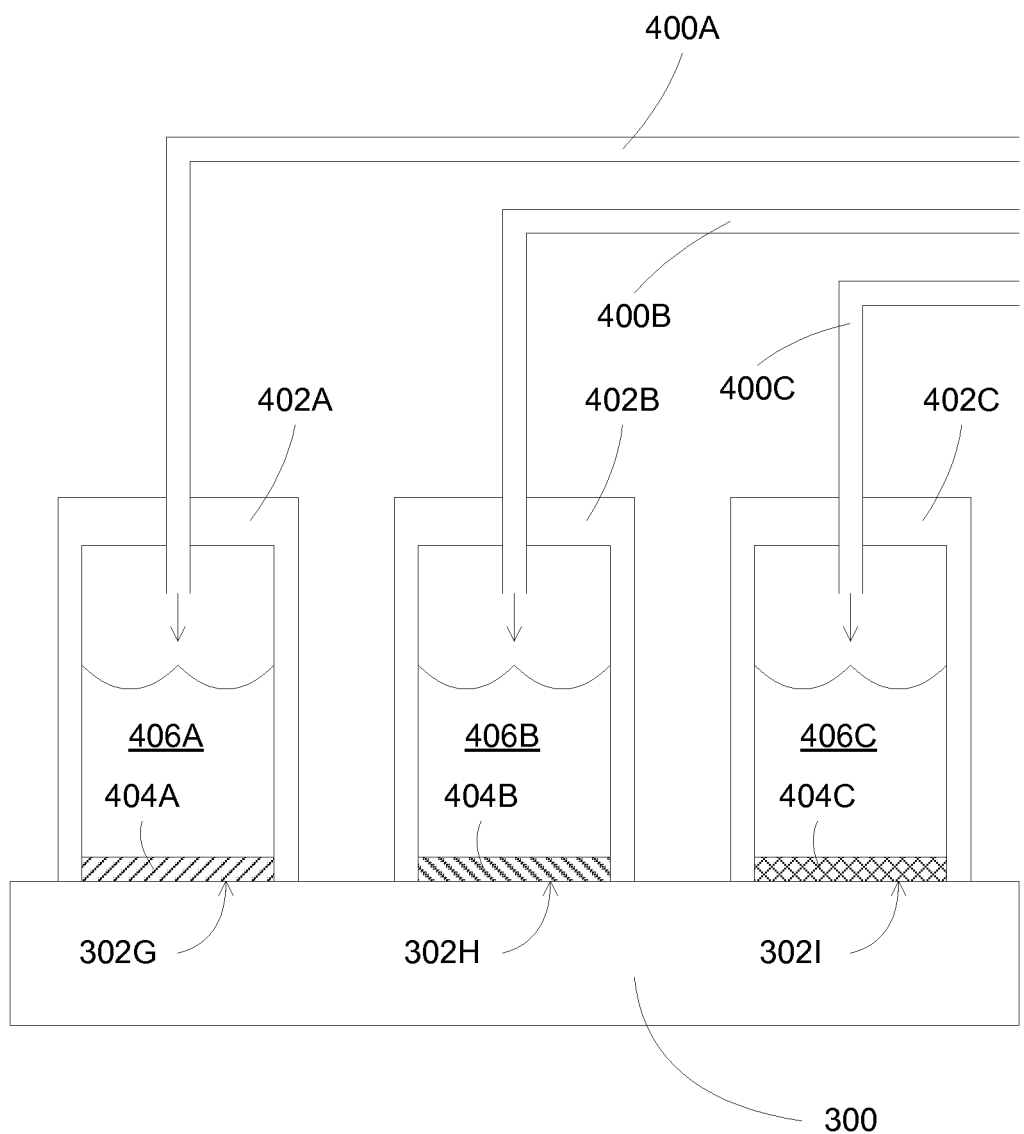
FIG. 4 illustrates a schematic diagram of a combinatorial wet processing system according to an embodiment described herein.

FIG. 4 illustrates a schematic diagram of a combinatorial wet processing system according to an embodiment described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302G-302I similar to the upper portion of FIG. 3. Solution dispensing nozzles, 400a-400c, supply different solution chemistries, 406A-406C, to chemical processing cells, 402A-402C. FIG. 4 illustrates the deposition of a layer, 404A-404C, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the site isolated regions are the areas of interest in a combinatorial process, since they provide the variations of process and material parameters, which can be evaluated to obtain the optimum device structures and fabrication processes. In some embodiments, the surface areas outside the isolated regions are also processed, such as, to clean or etch the outside surface area. For example, to clean the outside surface areas with a wet cleaning fluid, the isolated regions are protected and cleaning chemical is introduced to the substrate surface.

In some embodiments, selective portions of the substrate surface can be processed, for example, a substrate surface processing at regions outside the regions protected by a chuck. For example, multiple site isolate regions on the substrate are protected from an outside fluid. The surface region on the substrate is formed without any physical contact with the substrate, preventing any generation of particulates or debris caused by contact friction.

In some embodiments, the substrate surface is covered with a fluid, for example, to clean or wet etch the substrate surface. The present non-contact protected surface regions can allow the exclusion of certain surface areas on the substrate from being similarly processed by the fluid without any potential damage caused by added particles.

In some embodiments, a protective chuck can be disposed on a surface region of a substrate with a gas bearing layer in between. The gas bearing comprises a gas layer with adequate gas pressure to levitate the protective chuck about the substrate surface, preventing the protective chuck from contacting the substrate, and to form a barrier region, blocking the outside fluid.

Figure 5A:
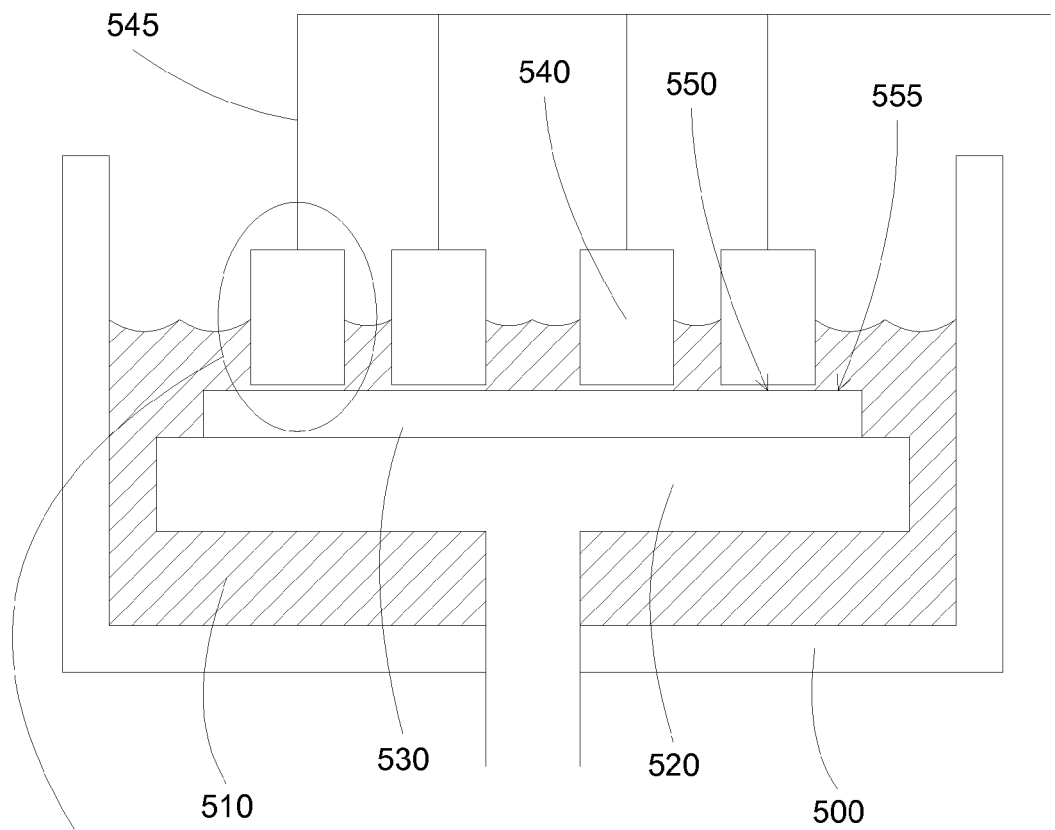
FIGS. 5A-5B illustrate an exemplary surface protection with air bearing layer according to some embodiments of the present invention.
Figure 5B:
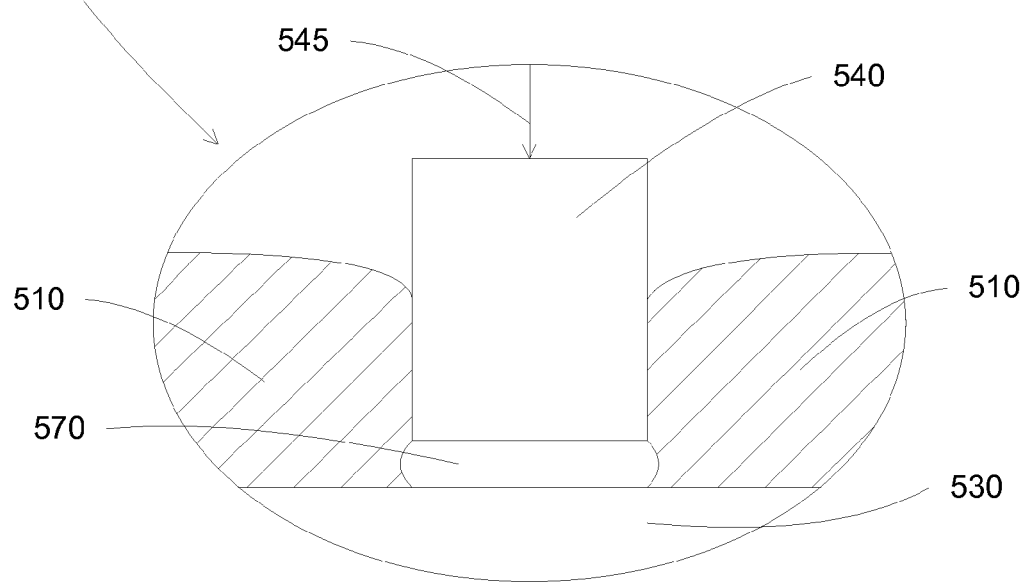

FIGS. 5A-5B illustrate an exemplary surface protection with air bearing layer according to some embodiments of the present invention. In FIG. 5A, a process chamber 500 supports a chuck 520 having a substrate 530 disposed thereon. The substrate 530 is submerged in a processing fluid 510, for example, a cleaning fluid, a rinsing fluid, or an etching fluid. The process chamber 500 can be a part of a HPC system, which comprises a plurality of protective chucks 540 protecting isolated regions 550 of the substrate. Gas lines 545 can be supplied to the protective chucks 540, for example, to pressurize the inside of the protective chucks 540 against the surrounding fluid 510. The surface area 555 of the substrate, outside the protected isolated regions 550, is processed by the processing fluid 510.

FIG. 5B shows an exemplary configuration of a protective chuck 540 protecting surface 550 regions of the substrate 530 against the fluid processing 510. A gas layer 570 is formed under the protective chuck 540, for example, with supplied gas coming from gas inlet 545. The gas layer 570 forms a pressurized layer, preventing the fluid 510 from entering the surface region 550. The fluid 510 thus stays within the surface region 555, outside the region 550. The gas layer 570 provides a non-contact protection of the region 550, eliminating any particle or debris generation due to abrasive contacts.

In some embodiments, the protective chuck comprises a substantially flat bottom surface, e.g., the surface to be disposed in proximity with the substrate surface. The protective chuck also comprises a second surface covering the remaining surface of the protective chuck, including the side surface and the top surface. The substantially flat bottom surface can form a substantially uniform gap with the substrate, enabling a gas flow across the flat bottom surface to create a gas bearing through a higher pressure gas layer than the outside ambient.

Figure 6A:
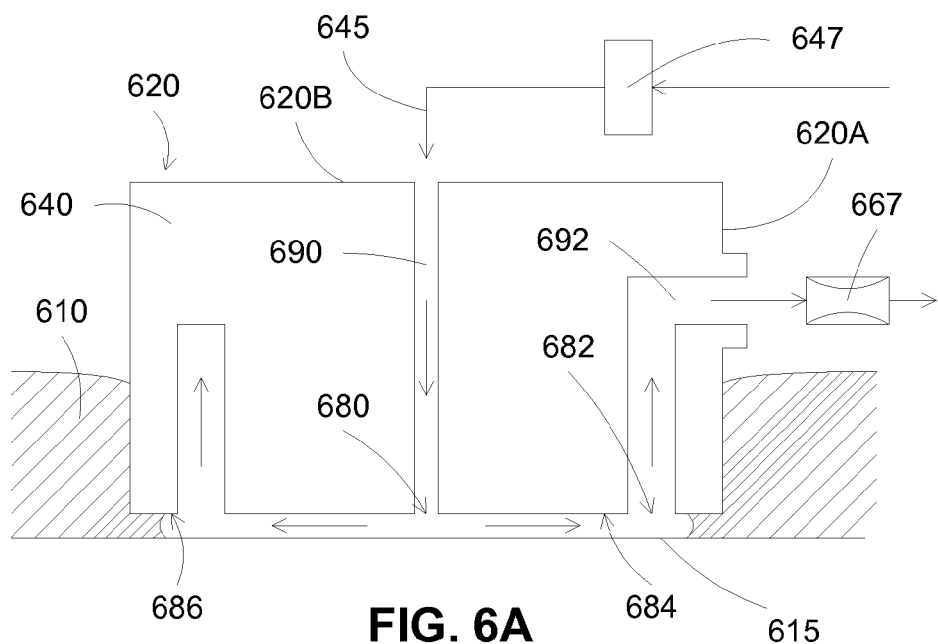
FIGS. 6A-6B illustrate an exemplary protective chuck according to some embodiments of the present invention.
Figure 6B:
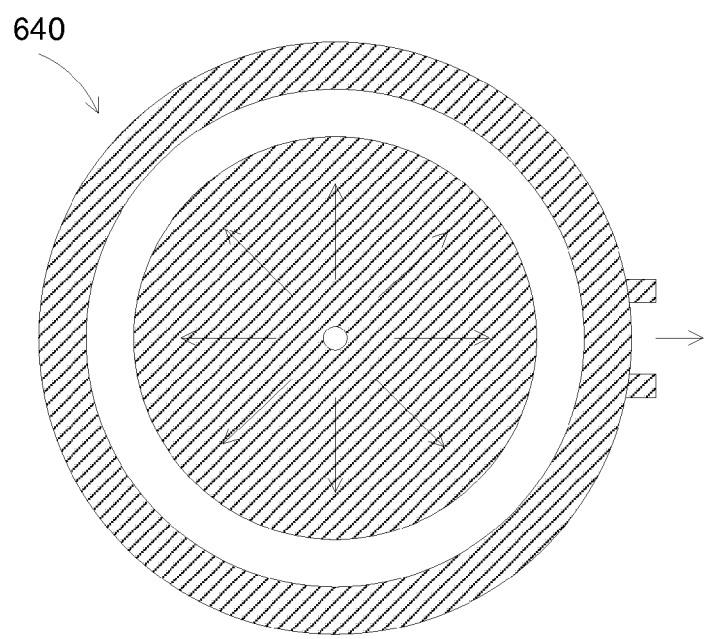

FIGS. 6A-6B illustrate an exemplary protective chuck according to some embodiments of the present invention. FIG. 6A shows a cross section side view and FIG. 6B shows a bottom view of the protective chuck 640. The protective chuck 640 comprises a substantially flat bottom surface 684 and 686, to be disposed in close proximity with the substrate surface 615. The protective chuck also comprises a second surface 620, covering the rest of the chuck surface, for example, comprising a top surface 620B and a side surface 620A. The second surface can be used for gas connection, such as inlet and outlet ports for gas supply to form the gas bearing layer.

In some embodiments, the bottom flat surface comprises two substantially flat areas: an outer substantially flat area 686 surrounding a peripheral of the bottom surface and an inner substantially flat area 684 surrounding an inner opening 680, such as a recessed area. The inner opening 680 is preferably disposed at a center of the bottom surface, but can be located anywhere within the inner substantially flat area 684. The area 682 between the outer flat area 686 and the inner flat area 684 is also preferably recessed, forming an outer recessed ring 682 surrounding the inner flat area. A gas flow 647 between the opening 680 and the recessed area 682 along the inner flat area 684 can establish a gas layer, which can act as an air bearing to levitate the protective chuck 640 above the substrate surface 615.

The opening 680 and the recessed area 682 are coupled to first and second conduits 690 and 692, respectively, leading to the second surface 620, e.g., the outside surface of the protective chuck, to form an inlet and an outlet of a gas flow. For example, first conduit 690 connects the inner opening 680 with the top surface 620B of the chuck. Second conduit 692 connects the outer recessed area 682 with the side surface 620A of the chuck. Coupling can be provided at the end of the conduits at the outside surface for ease of connection to an external gas flow assembly. One conduit can serve as a gas inlet, and the other conduit served as a gas outlet. For example, the first conduit 690 can accept a gas input flow through a coupling to a gas source 645, preferably through a flow meter 649 to measure the gas flow, or a flow controller to control the gas flow. The second conduit 692 can be left open, forming a vent ring that releases the gas output flow to atmosphere. A restricting valve 667 can be coupled to the gas output flow, for example, externally to the protective chuck after the gas outlet, or internally within the second conduit, to regulate a flow resistance, or a flow conductance, of the gas flow, effectively affecting the gas pressure at the gas bearing layer. For example, with a same gas flow at the first conduit inlet, a more restricted second conduit would increase the gas pressure at the gas bearing layer.

In some embodiments, the gas flow between the first and second conduits along the inner substantially flat area forms a gas layer that levitates the protective chuck and protects the surface region of the substrate from a fluid disposed on the substrate outside the surface region. In some embodiments, other means to levitating the protective chuck can be used, such as magnetic levitation or electric repulsion.

During processing, a liquid 610 is introduced to a region on the substrate surface, outside the region covered by the bottom surface of the chuck. The gas bearing layer can prevent the liquid 610 from reaching the substrate surface region under the bottom surface of the chuck. The liquid can be a processing liquid, for example, an etch solution to etch a layer on the substrate. Since the substrate surface region under the chuck is protected by the gas bearing, the etching process only etches the substrate surface outside the chuck area. After finish processing, the liquid 610 is drained, e.g., removed from the substrate surface. However, in some areas under the chuck, for example, at corners or dead spaces under the chuck, there might be liquid residues.

Figure 7A:
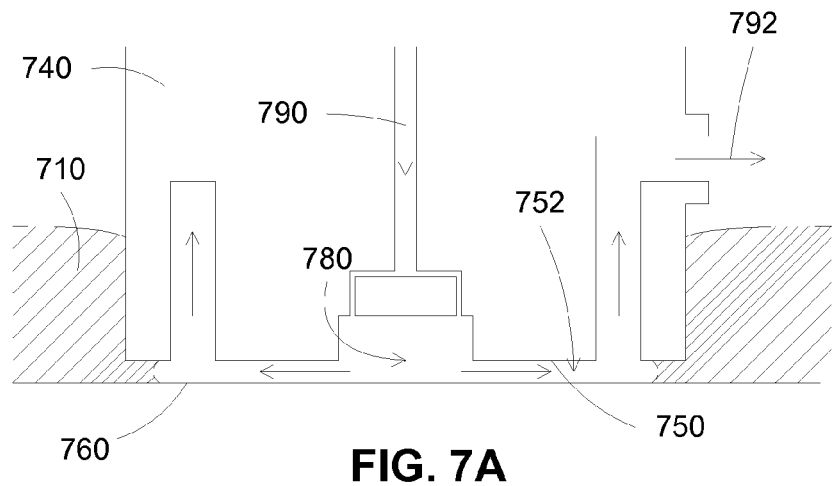
FIGS. 7A-7B illustrate an exemplary operation of a protective chuck according to some embodiments of the present invention.
Figure 7B:
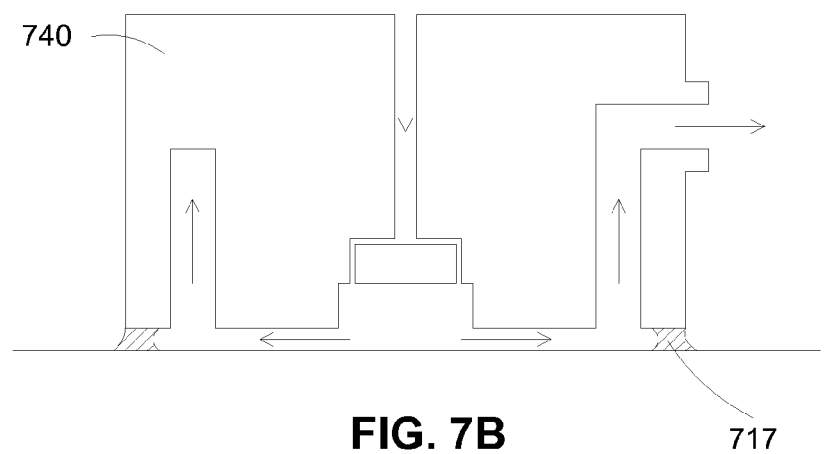

FIGS. 7A-7B illustrate an exemplary operation of a protective chuck according to some embodiments of the present invention. A protective chuck 740 comprises a bottom surface 750 disposed on, but not touching, a substrate surface 760, forming a pocket of gas pressure 752 between the two surfaces. An input gas flow 790 is provided through an inlet port, which flows along the bottom surface 750, and exits 792 through an exhaust port. Second conduit 792 provides an exhaust for the input gas after passing through the inner flat area 784. A recessed area 780 can be provided for optimizing the gas flow comprising a plurality of outlets distributed in a peripheral of the recessed area 780.

In FIG. 7A, a liquid 710 is introduced to a region on the substrate surface, outside the region covered by the bottom surface of the chuck. A gas bearing layer can be formed under the bottom surface 750 of the chuck due to the gas flow 790/792, which prevents the liquid 710 from reaching the substrate surface region under the bottom surface of the chuck. The liquid can be a processing liquid, for example, an etch solution to etch a layer on the substrate. Since the substrate surface region under the chuck is protected by the gas bearing 752, the etching process only etches the substrate surface outside the chuck area.

After finish processing, the liquid 710 is drained, e.g., removed from the substrate surface. Liquid residues 717 can remain in some areas under the chuck, for example, at dead spaces between the gas flow 790/792 and the outside substrate surface.

In some embodiments, the present invention discloses methods and systems for cleaning or rinsing the substrate after processing. For example, after processing of substrate surface regions outside the areas protected by a chuck, liquid residues, especially processing liquid residues, can remain in some areas, which can contaminate the devices in subsequent processes.

In some embodiments, the present invention discloses methods for cleaning the substrate surface using the same gas flow for forming the gas bearing layer.

Figure 8A:
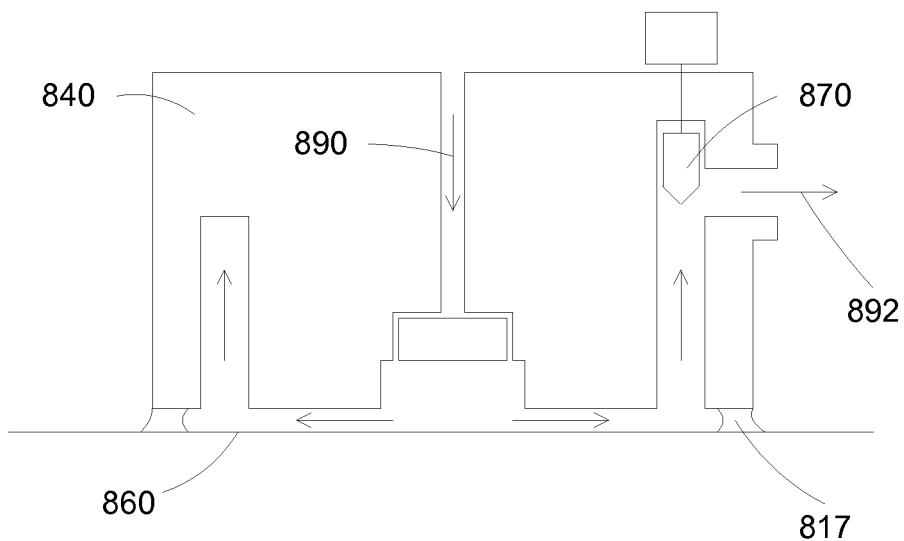
FIGS. 8A-8B illustrate an exemplary method for removing liquid residues according to some embodiments of the present invention.
Figure 8B:
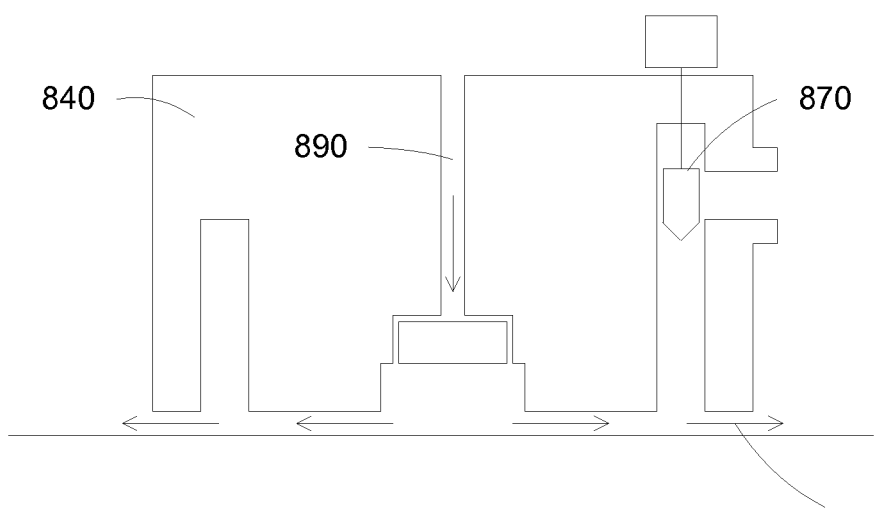

FIGS. 8A-8B illustrate an exemplary method for removing liquid residues according to some embodiments of the present invention. A protective chuck 840 comprises an inlet for accepting a gas flow 890 and an outlet for exhausting the gas flow 892. The chuck 840 can further comprise an integrated flow restrictor 870 coupled to the exhaust port. The flow restrictor can be an on-off valve, turning on or turning off the gas flow 890/892. The flow restrictor 870 can be a metering valve, allowing adjustment of the gas flow. As shown, the flow restrictor is integrated to the exhaust port, but the present invention is not so limited, and the flow restrictor can be disposed at the inlet port, or disposed external to the chuck 840.

FIG. 8A shows a chuck 840 disposed on a substrate surface 860 after completing the cleaning of the regions outside the area of the chuck surface. As shown, the flow restrictor 870 is open, allowing the gas flow through the inlet 890 to the exhaust port 892. Some processing liquid residues 817 might remain, for example, at corners of the exhaust flow.

In FIG. 8B, the flow restrictor is close, forcing the gas flow to exit through the bottom of the chuck 813. The flow 813 can remove any liquid residues remaining under the chuck. In some embodiments, the flow restrictor can be partially close, to regulate the flow 813 during the liquid residue removal.

Figure 9:
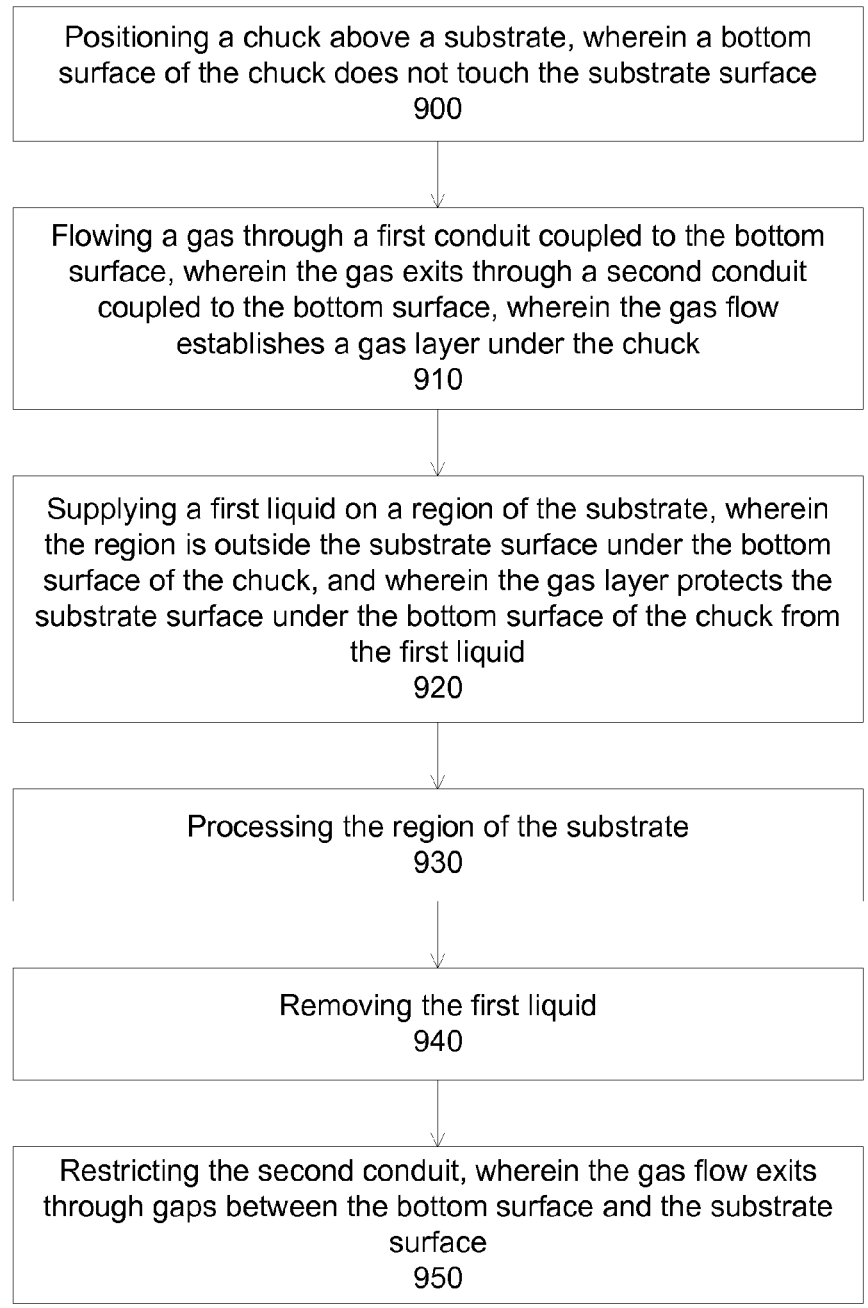
FIG. 9 illustrates an exemplary flowchart for removing liquid residues according to some embodiments of the present invention.

In some embodiments, the present invention discloses methods for processing a substrate, using a protective chuck configured for forming a gas bearing at a bottom surface of the protective chuck. FIG. 9 illustrates an exemplary flowchart for removing liquid residues according to some embodiments of the present invention. In operation 900, a chuck is positioned above a substrate, wherein a bottom surface of the chuck does not touch the substrate surface. In operation 910, a gas is flowed through a first conduit coupled to the bottom surface, wherein the gas exits through a second conduit coupled to the bottom surface, wherein the gas flow establishes a gas layer under the chuck. The sequence is not critical, and in some embodiments, after supplying a gas flow to the protective chuck to create a gas flow along the bottom surface, the protective chuck is lowered onto a substrate.

The gas flow can from a gas bearing layer under the protective chuck. In some embodiments, the gas flow can cause the protective chuck to be levitated above the substrate surface, forming a surface region on the substrate that is protected by the gas bearing layer against a fluid disposed on the substrate surface outside the surface region.

In operation 920, a first liquid is supplied on a region of the substrate, wherein the region is outside the substrate surface under the bottom surface of the chuck, and wherein the gas layer protects the substrate surface under the bottom surface of the chuck from the first liquid. The gas pressure of the gas bearing layer can prevent the fluid from entering the protected region, and at the same time, preventing the protective chuck from contacting the substrate.

In some embodiments, the protective chuck protects the surface region from the fluid without contacting the surface region. The gas pressure of the gas bearing layer can be configured to balance the fluid flow, forcing the fluid to stay outside the surface region protected by the protective chuck. The boundary between the gas layer and the outside fluid can be at the outer edge of the protective chuck, or can be somewhat inside the edge, depending on the gas pressure.

In operation 930, the region of the substrate outside the areas of the protective chuck is processed. In operation 940, the first liquid is removed. In operation 950, the second conduit is restricted, either by shutting off or by reducing the gas flow through the exhaust port, wherein the gas flow exits through gaps between the bottom surface and the substrate surface.

In some embodiments, the present invention discloses methods for rinsing the substrate surface using a rinsing liquid entering the exhaust port.

Figure 10A:
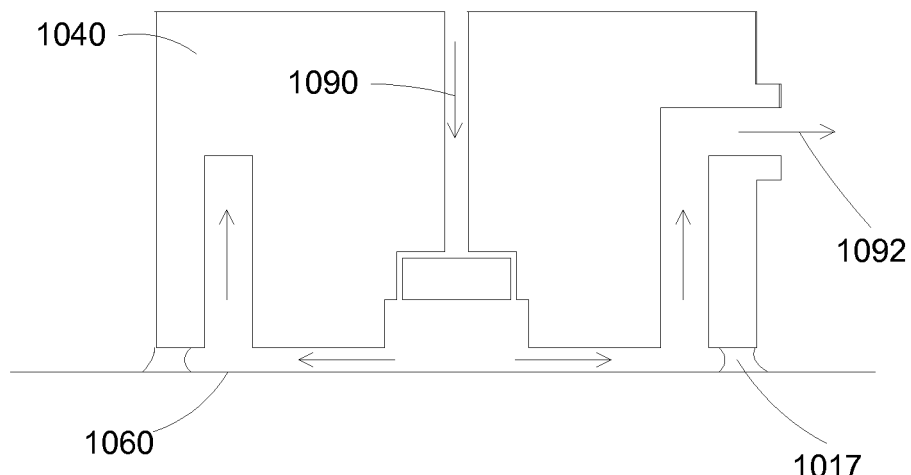
FIGS. 10A-10B illustrate another exemplary method for removing liquid residues according to some embodiments of the present invention.
Figure 10B:
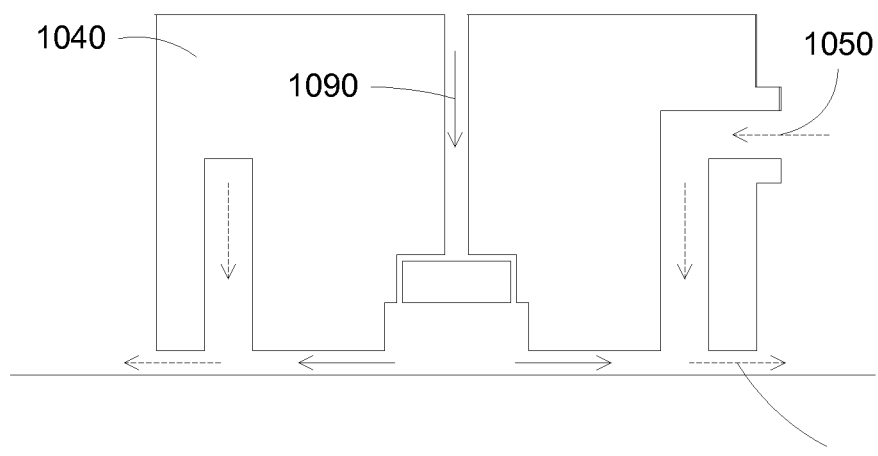

FIGS. 10A-10B illustrate another exemplary method for removing liquid residues according to some embodiments of the present invention. A protective chuck 1040 comprises an inlet for accepting a gas flow 1090 and an outlet for exhausting the gas flow 1092. FIG. 10A shows a chuck 1040 disposed on a substrate surface 1060 after completing the cleaning of the regions outside the area of the chuck surface. Some processing liquid residues 1017 might remain, for example, at corners of the exhaust flow or at gaps 1019 between the bottom of the chuck and the substrate surface.

In FIG. 10B, a rinsing liquid, such as water, is coupled to the exhaust port to generate a liquid flow 1050. The gas flow 1090 and the liquid flow 1050 then exit 1013 through the bottom of the chuck at the gap 1019. The flow 1013 can remove any liquid residues remaining under the chuck.

Figure 11:
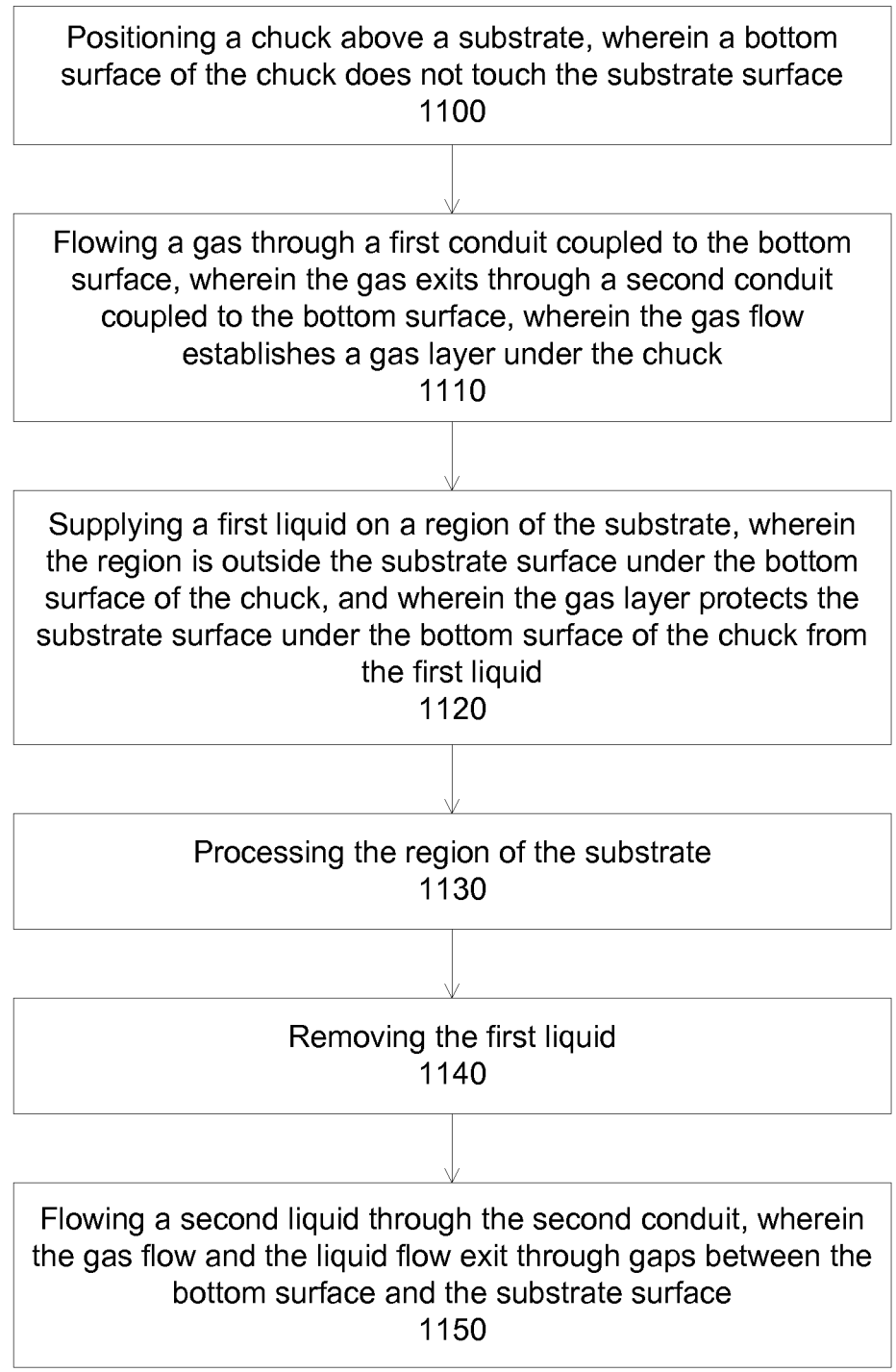
FIG. 11 illustrates another exemplary flowchart for removing liquid residues according to some embodiments of the present invention.

FIG. 11 illustrates another exemplary flowchart for removing liquid residues according to some embodiments of the present invention. In operation 1100, a chuck is positioned above a substrate, wherein a bottom surface of the chuck does not touch the substrate surface. In operation 1010, a gas is flowed through a first conduit coupled to the bottom surface, wherein the gas exits through a second conduit coupled to the bottom surface, wherein the gas flow establishes a gas layer under the chuck.

In operation 1120, a first liquid is supplied on a region of the substrate, wherein the region is outside the substrate surface under the bottom surface of the chuck, and wherein the gas layer protects the substrate surface under the bottom surface of the chuck from the first liquid. The gas pressure of the gas bearing layer can prevent the fluid from entering the protected region.

In operation 1130, the region of the substrate outside the areas of the protective chuck is processed. In operation 1140, the first liquid is removed. In operation 1150, a second liquid is flowed through the second conduit, wherein the gas flow and the liquid flow exit through gaps between the bottom surface and the substrate surface. In some embodiments, the second conduit, e.g., the exhaust line for the gas flow, is coupled to a manifold, with a switching valve for switching between a gas outlet and a liquid inlet. During a first phase of processing, the switching valve is connected to the gas outlet for exhausting the gas flow. During the second phase of liquid rinsing, the switching valve is connected to the liquid inlet for accepting the liquid, flowing to the inside of the bottom surface of the chuck for cleaning and rinsing any liquid residues.

In some embodiments, the present invention discloses methods for rinsing the substrate surface using a rinsing liquid entering the gas flow inlet.

Figure 12A:
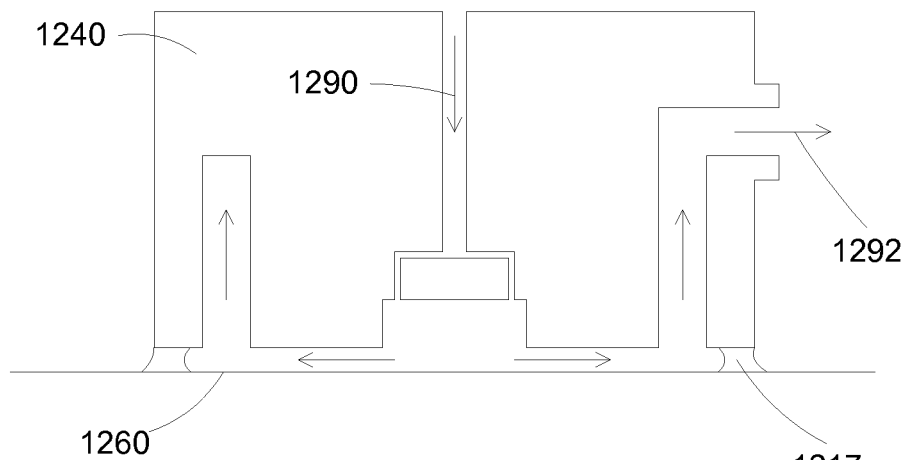
FIGS. 12A-12B illustrate another exemplary method for removing liquid residues according to some embodiments of the present invention.
Figure 12B:
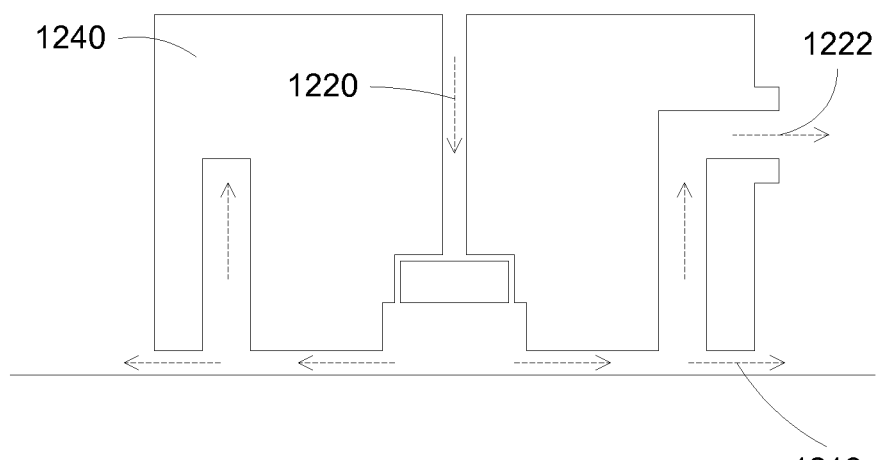

FIGS. 12A-12B illustrate another exemplary method for removing liquid residues according to some embodiments of the present invention. A protective chuck 1240 comprises an inlet for accepting a gas flow 1290 and an outlet for exhausting the gas flow 1292. FIG. 12A shows a chuck 1240 disposed on a substrate surface 1260 after completing the cleaning of the regions outside the area of the chuck surface. Some processing liquid residues 1217 might remain, for example, at corners of the exhaust flow.

In FIG. 12B, a rinsing liquid, such as water, is coupled to the inlet port to generate a liquid flow 1220. The liquid flow 1220 replaces the gas flow 1290, which then exits through the exhaust port 1222, and through the bottom of the chuck 1213. The flow 1213 can remove any liquid residues remaining under the chuck. A flow restrictor (not shown) can be coupled to the exhaust port to regulate the liquid flow 1222, optimizing the rinsing and cleaning action of the liquid flow 1213.

Figure 13:
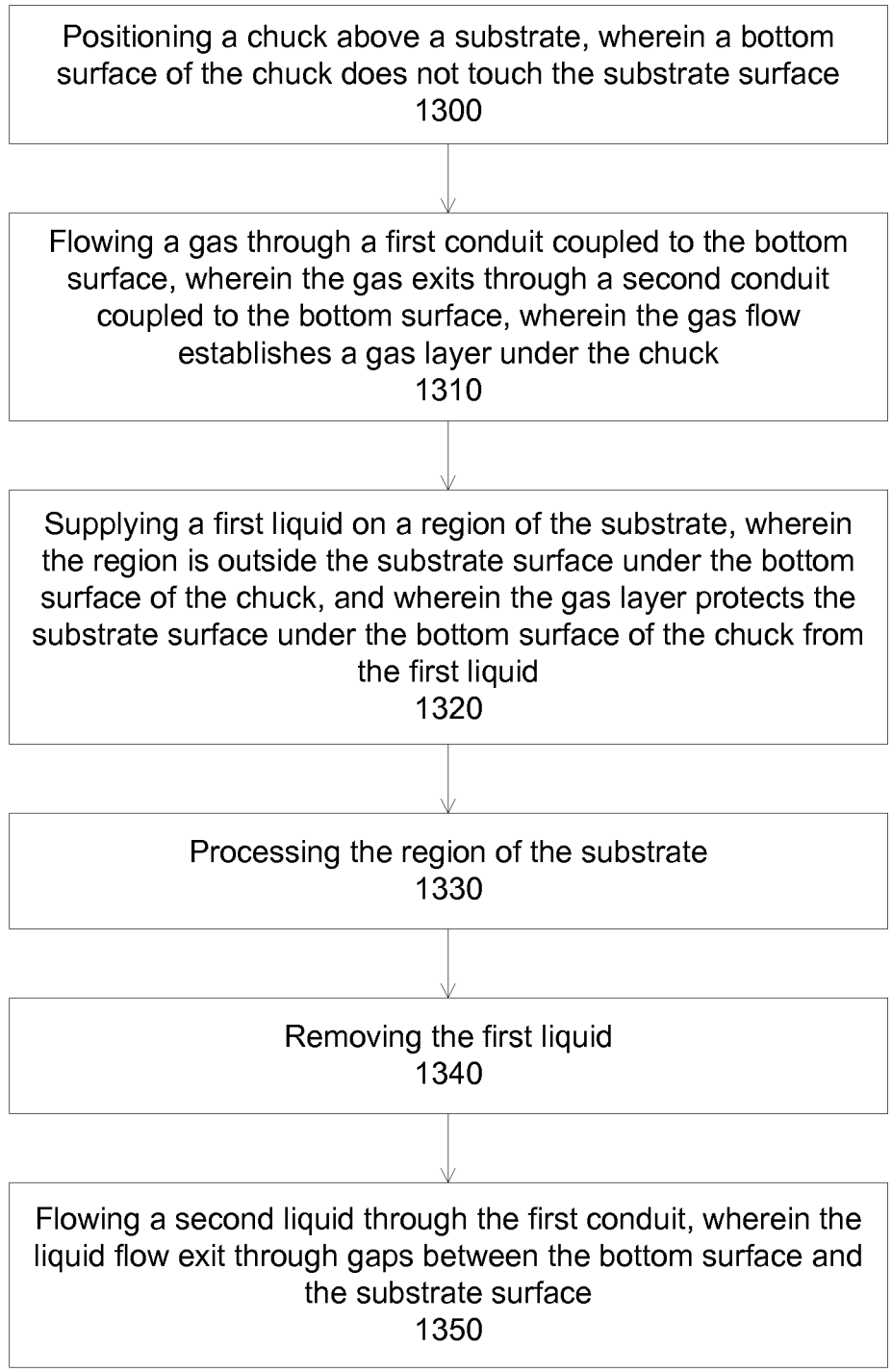
FIG. 13 illustrates another exemplary flowchart for removing liquid residues according to some embodiments of the present invention.

FIG. 13 illustrates another exemplary flowchart for removing liquid residues according to some embodiments of the present invention. In operation 1300, a chuck is positioned above a substrate, wherein a bottom surface of the chuck does not touch the substrate surface. In operation 1310, a gas is flowed through a first conduit coupled to the bottom surface, wherein the gas exits through a second conduit coupled to the bottom surface, wherein the gas flow establishes a gas layer under the chuck.

In operation 1320, a first liquid is supplied on a region of the substrate, wherein the region is outside the substrate surface under the bottom surface of the chuck, and wherein the gas layer protects the substrate surface under the bottom surface of the chuck from the first liquid. The gas pressure of the gas bearing layer can prevent the fluid from entering the protected region.

In operation 1330, the region of the substrate outside the areas of the protective chuck is processed. In operation 1340, the first liquid is removed. In operation 1350, a second liquid is flowed through the first conduit, wherein the liquid flow exits through gaps between the bottom surface and the substrate surface, in addition to through the second conduit. In some embodiments, the first conduit, e.g., the inlet line for the gas flow, is coupled to a manifold, with a switching valve for switching between a gas outlet and a liquid inlet. During a first phase of processing, the switching valve is connected to the gas outlet for providing the gas flow. During the second phase of liquid rinsing, the switching valve is connected to the liquid inlet for accepting the liquid, flowing to the inside of the bottom surface of the chuck for cleaning and rinsing any liquid residues.

Figure 14A:
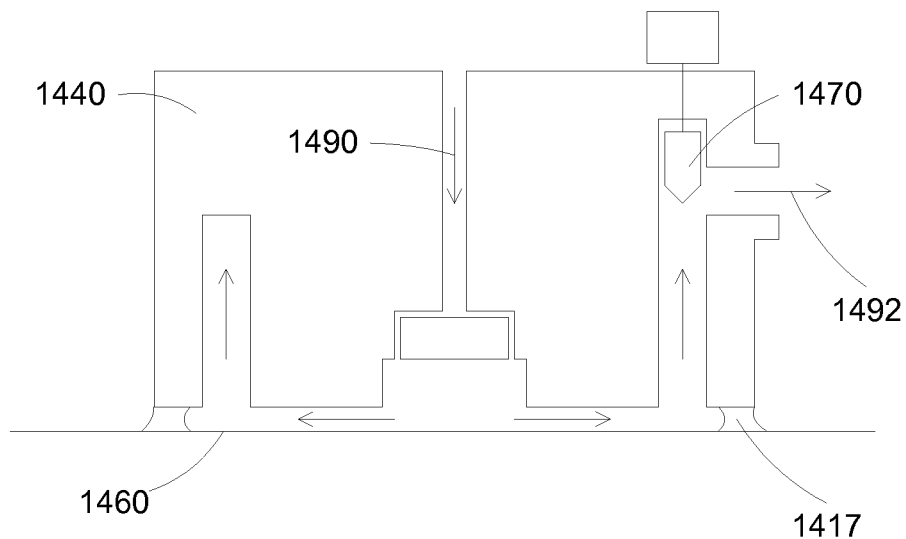
FIGS. 14A-14B illustrate another exemplary method for removing liquid residues according to some embodiments of the present invention.
Figure 14B:
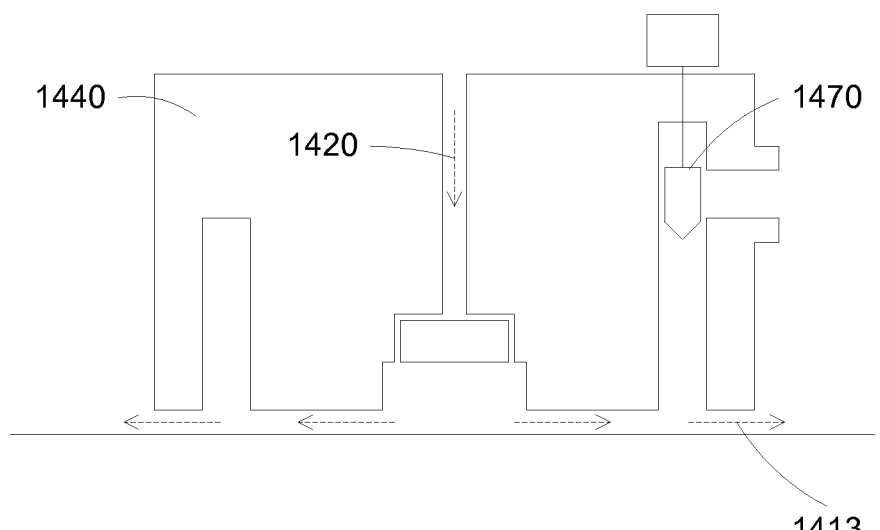

FIGS. 14A-14B illustrate another exemplary method for removing liquid residues according to some embodiments of the present invention. A protective chuck 1440 comprises an inlet for accepting a gas flow 1490 and an outlet for exhausting the gas flow 1492. The chuck 1440 can further comprise an integrated flow restrictor 1470 coupled to the exhaust port. The flow restrictor can be an on-off valve, turning on or turning off the gas flow 1490/1492. The flow restrictor 1470 can be a metering valve, allowing adjustment of the gas flow.

FIG. 14A shows a chuck 1440 disposed on a substrate surface 1460 after completing the cleaning of the regions outside the area of the chuck surface. As shown, the flow restrictor 1470 is open, allowing the gas flow through the inlet 1490 to the exhaust port 1492. Some processing liquid residues 1417 might remain, for example, at corners of the exhaust flow.

In FIG. 14B, the flow restrictor is close, forcing the gas flow to exit through the bottom of the chuck 1413. The flow 1413 can remove any liquid residues remaining under the chuck. In some embodiments, the flow restrictor can be partially close, to regulate the flow 1413 during the liquid residue removal. A rinsing liquid, such as water, is coupled to the inlet port to generate a liquid flow 1420. The liquid flow 1420 replaces the gas flow 1490, which then exits through the bottom of the chuck 1413. The flow 1413 can remove any liquid residues remaining under the chuck. The flow restrictor 1470 can be partially open to regulate a liquid flow through the exhaust port, optimizing the rinsing and cleaning action of the liquid flow 1413.

Figure 15:
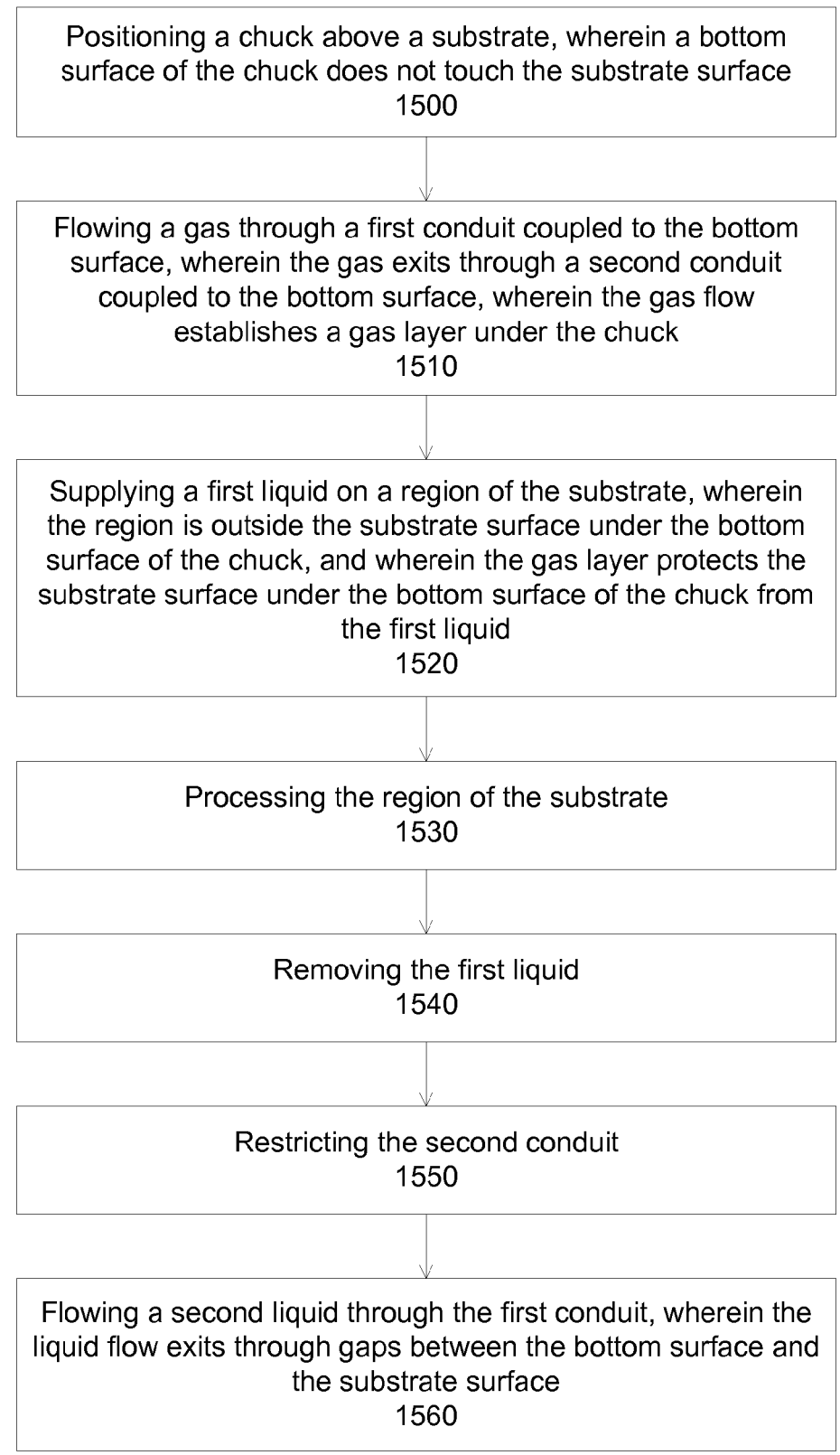
FIG. 15 illustrates another exemplary flowchart for removing liquid residues according to some embodiments of the present invention.

FIG. 15 illustrates another exemplary flowchart for removing liquid residues according to some embodiments of the present invention. In operation 1500, a chuck is positioned above a substrate, wherein a bottom surface of the chuck does not touch the substrate surface. In operation 1510, a gas is flowed through a first conduit coupled to the bottom surface, wherein the gas exits through a second conduit coupled to the bottom surface, wherein the gas flow establishes a gas layer under the chuck.

In operation 1520, a first liquid is supplied on a region of the substrate, wherein the region is outside the substrate surface under the bottom surface of the chuck, and wherein the gas layer protects the substrate surface under the bottom surface of the chuck from the first liquid. The gas pressure of the gas bearing layer can prevent the fluid from entering the protected region.

In operation 1530, the region of the substrate outside the areas of the protective chuck is processed. In operation 1540, the first liquid is removed. In operation 1550, the second conduit is restricted, either fully or partially. In operation 1560, a second liquid is flowed through the first conduit, wherein the liquid flow exits through gaps between the bottom surface and the substrate surface, in addition to through the second conduit, if the second conduit is partially restricted. In some embodiments, the first conduit, e.g., the inlet line for the gas flow, is coupled to a manifold, with a switching valve for switching between a gas outlet and a liquid inlet. During a first phase of processing, the switching valve is connected to the gas outlet for providing the gas flow. During the second phase of liquid rinsing, the switching valve is connected to the liquid inlet for accepting the liquid, flowing to the inside of the bottom surface of the chuck for cleaning and rinsing any liquid residues.

In some embodiments, the present invention discloses an additional conduit, dedicated for liquid flow, in the protective chuck. The additional conduit can allow optimization of the cleaning and rinsing action, permitting uniformly and thoroughly cleaning all remaining residues on the substrate after processing.

Figure 16A:
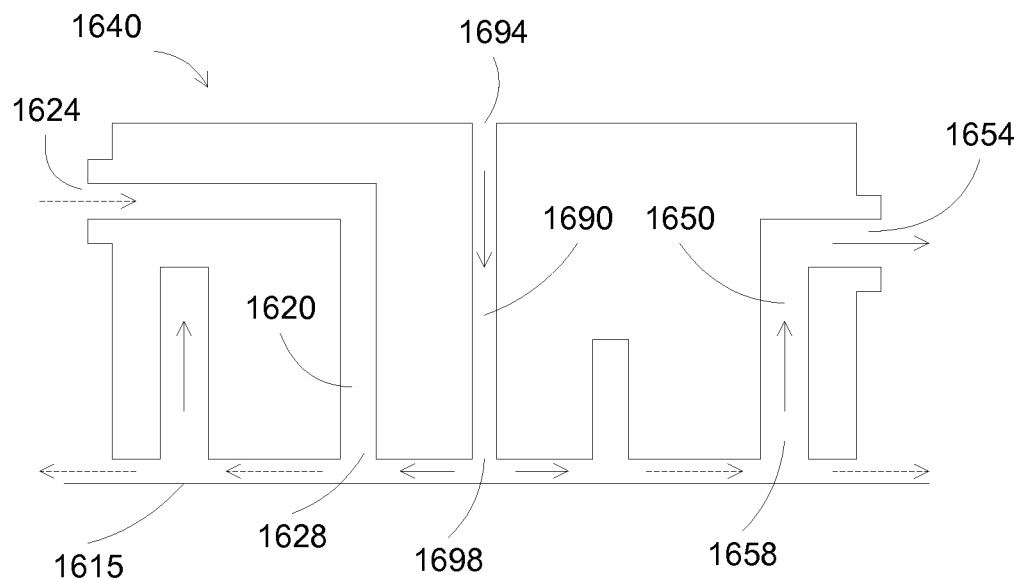
FIGS. 16A-16B illustrate an exemplary protective chuck according to some embodiments of the present invention.
Figure 16B:
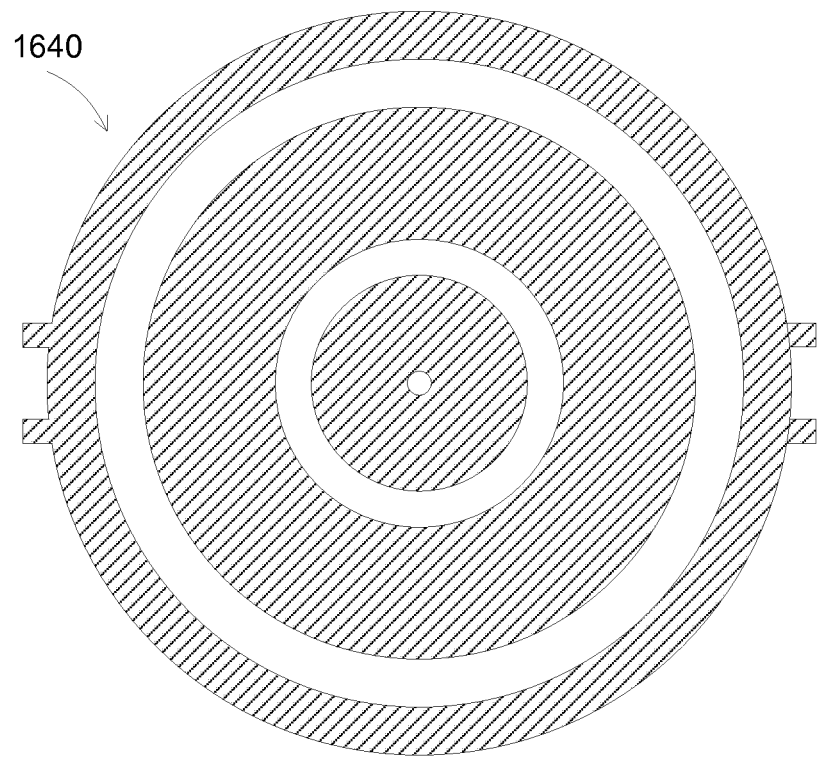

FIGS. 16A-16B illustrate an exemplary protective chuck according to some embodiments of the present invention. FIG. 16A shows a cross section side view and FIG. 16B shows a bottom view of the protective chuck 1640. The protective chuck 1640 comprises a substantially flat bottom surface, to be disposed in close proximity with the substrate surface 1615.

In some embodiments, the protective chuck 1640 comprises three conduits 1690, 1620 and 1650 for flowing different materials. For example, a center conduit 1690 can accept a gas flow. An edge conduit 1650 can accept an exhaust from the gas flow in conduit 1690, and together with conduit 1690, generate a gas barrier layer under the chuck. The three conduits 1690, 1620 and 1650 terminate at the bottom surface of the chuck 1698, 1628, and 1658, together with an inlet 1694, 1624, and 1654 for coupling to a gas source, liquid source or exhaust line, respectively.

Figure 17A:
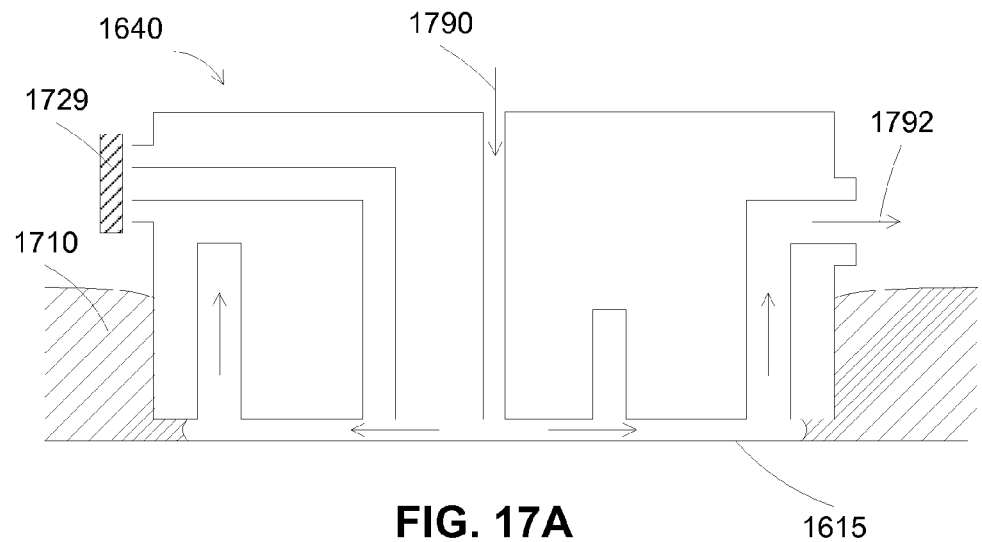
FIGS. 17A-17D illustrate an exemplary method for rinsing the substrate according to some embodiments of the present invention.

FIGS. 17A-17D illustrate an exemplary method for rinsing the substrate according to some embodiments of the present invention. In FIG. 17A, a restrictor 1729 blocks the conduit 1620 of the protective chuck 1640. As shown, restrictor 1729 comprises an external valve, fully blocks the inlet 1624 of the conduit 1620. A gas flow 1790 enters the inlet 1694, exits the terminated opening 1698, flows along the bottom surface of the chuck 1640, returns to the terminated opening 1658, and exits the outlet 1654, establishing a gas layer, which can act as an air bearing between the bottom of the protective chuck 1640 and the substrate surface 1615.

In some embodiments, the gas flow between the first and second conduits along the inner substantially flat area forms a gas layer that levitates the protective chuck and protects the surface region of the substrate from a fluid disposed on the substrate outside the surface region. In some embodiments, other means to levitating the protective chuck can be used, such as magnetic levitation or electric repulsion.

During processing, a liquid 1710 is introduced to a region on the substrate surface, outside the region covered by the bottom surface of the chuck. The gas bearing layer can prevent the liquid 1710 from reaching the substrate surface region under the bottom surface of the chuck. The liquid can be a processing liquid, for example, an etch solution to etch a layer on the substrate. Since the substrate surface region under the chuck is protected by the gas bearing, the etching process only etches the substrate surface outside the chuck area.

Figure 17B:
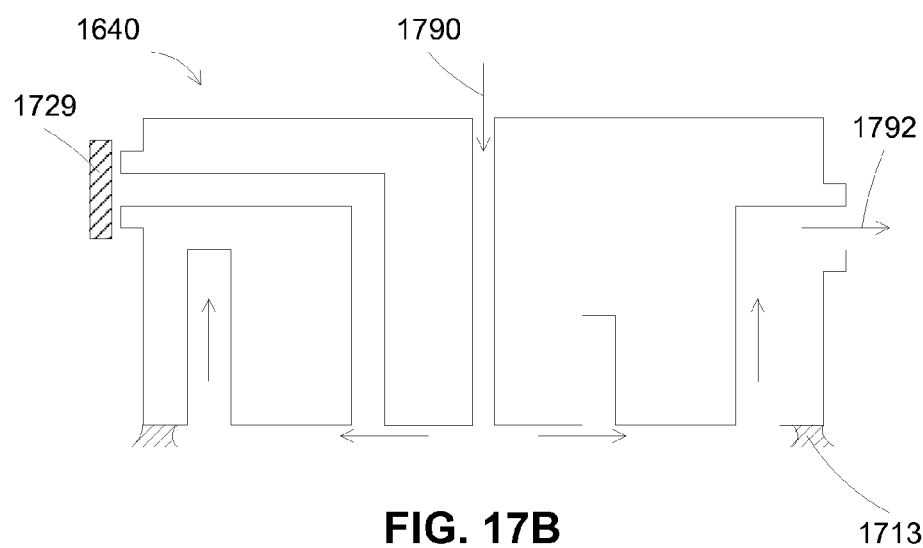

In FIG. 17B, the liquid 1710 is drained from the substrate surface after finish processing. However, in some areas 1713 under the chuck, for example, at corners or dead spaces under the chuck, there might be liquid residues.

Figure 17C:
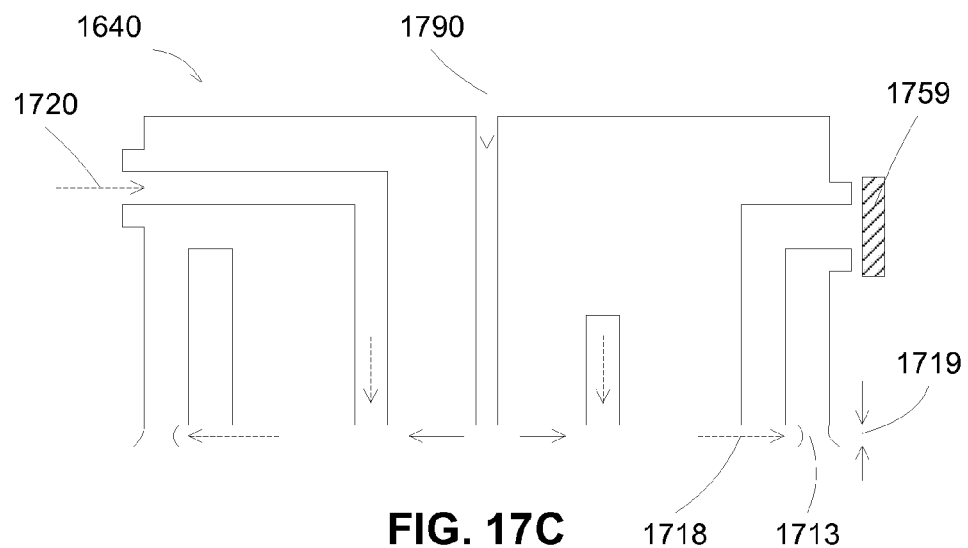

In FIG. 17C, the restrictor 1729 is removed, and a liquid flow 1720 is provided to the conduit 1620 at the inlet 1624. A second restrictor 1759 blocks the conduit 1650 of the protective chuck 1640. As shown, restrictor 1759 comprises an external valve, fully blocks the inlet 1654 of the conduit 1650. With the conduit 1650 blocked, the gas flow 1790 and the liquid flow 1720 can exit 1718 through the gaps 1719 between the chuck and the substrate, rinsing and cleaning the liquid residues 1713. In some embodiments, the gas flow 1790 serves to push the liquid flow 1720 toward the outer edges of the protective chuck 1640.

Figure 17D:
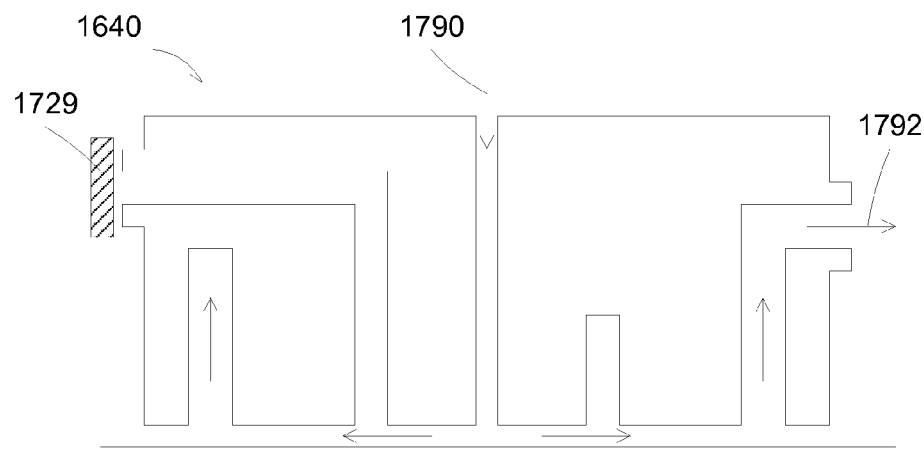

In FIG. 17D, after finish rinsing, the second restrictor 1759 is removed, and the restrictor 1729 blocks the conduit 1620 of the protective chuck 1640.

Figure 18A:
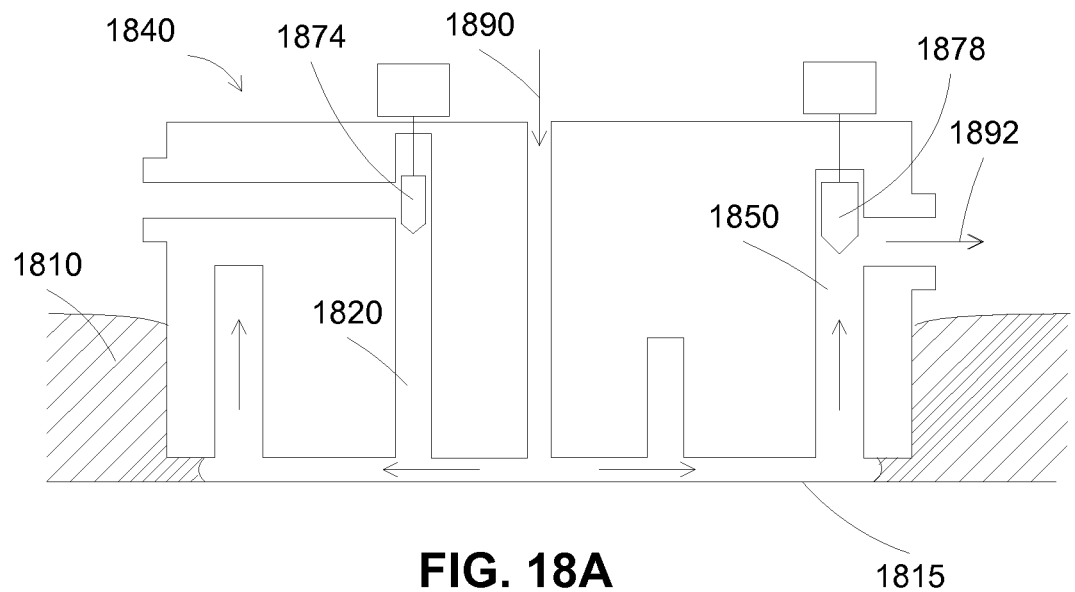
FIGS. 18A-18B illustrate another exemplary protective chuck according to some embodiments of the present invention.
Figure 18B:
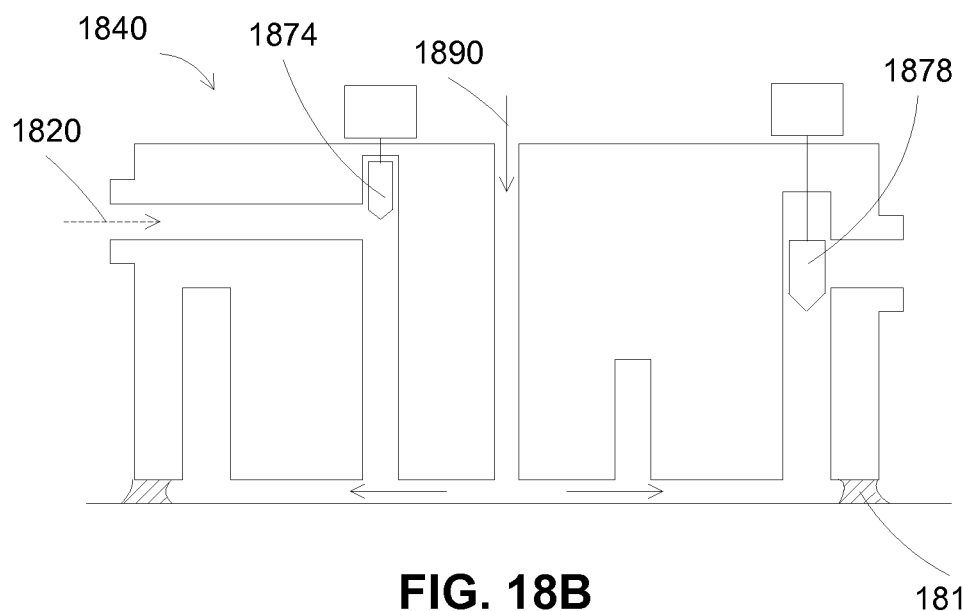

FIGS. 18A-18B illustrate another exemplary protective chuck according to some embodiments of the present invention. The protective chuck 1840 comprises a substantially flat bottom surface, to be disposed in close proximity with the substrate surface 1815. The protective chuck 1840 comprises an integrated flow restrictor 1874 coupled to the conduit 1820 and another integrated flow restrictor 1878 coupled to the exhaust conduit 1850. The flow restrictors can be an on-off valve, turning on or turning off the gas flow. The flow restrictors can be a metering valve, allowing adjustment of the gas flow.

FIG. 18A shows the protective chuck 1840 in processing mode, having liquid 1810 introduced outside the chuck 1840 for processing the substrate surface not protected by the chuck 1840. Restrictor 1874 blocks conduit 1820, and restrictor 1878 opens conduit 1850. Gas flow 1890 enters and exits 1892 through the opening of the restrictor 1878, creating gas layer to block the liquid 1810 from the region under the chuck.

FIG. 18B shows the protective chuck 1840 in rinsing and cleaning mode, after the liquid 1810 has been removed. Restrictor 1878 blocks conduit 1850, and restrictor 1874 opens conduit 1820. Liquid flow 1820 enters through the opening of the restrictor 1874, flowing between the bottom surface of the chuck and the top surface of the substrate to clean liquid residues 1813.

Figure 19:
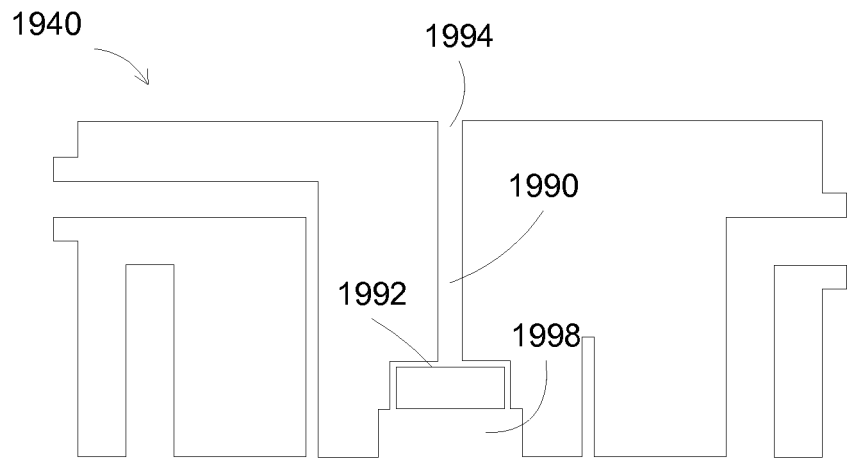
FIG. 19 illustrates another exemplary protective chuck according to some embodiments of the present invention.

FIG. 19 illustrates another exemplary protective chuck according to some embodiments of the present invention. Protective chuck 1940 has a gas conduit 1990 coupled to an inlet 1994, and terminated at a recess 1998 with multiple outlets 1992. The recess 1998 is preferably disposed at a center of the bottom surface, but can be located anywhere within the bottom surface. A gas flow enters the inlet 1994 and exits the recessed area 1998 to flow along the bottom surface of the chuck to establish a gas layer. Multiple outlets 1992 can be distributed at the recess 1998, controlling the uniformity of the gas flow along the bottom surface of the chuck.

Figure 20:
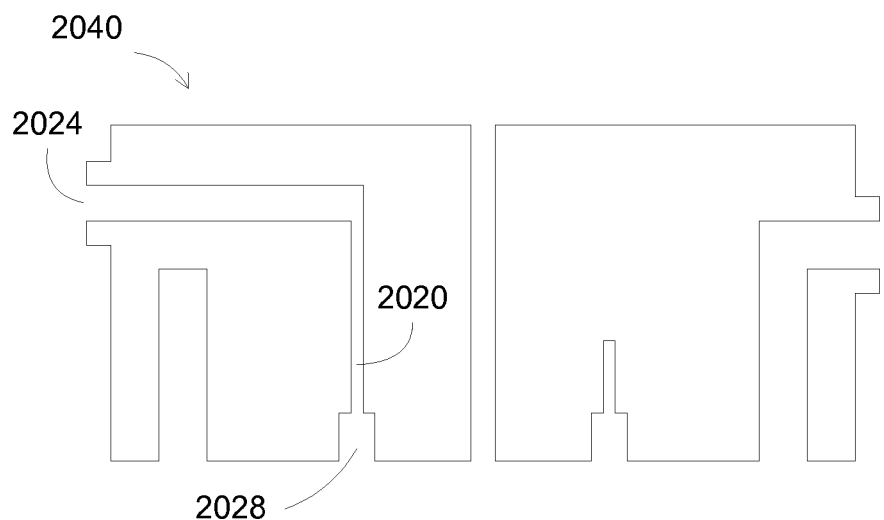
FIG. 20 illustrates another exemplary protective chuck according to some embodiments of the present invention.

FIG. 20 illustrates another exemplary protective chuck according to some embodiments of the present invention. Protective chuck 2040 has a liquid conduit 2020 coupled to an inlet 2024, and terminated at a recess 2028. The recess 2028 is preferably disposed at a ring surrounding the center conduit, but can be located anywhere within the bottom surface. Multiple outlets can be distributed at the recess 2028, controlling the uniformity of the fluid flow along the bottom surface of the chuck.

Figure 21A:
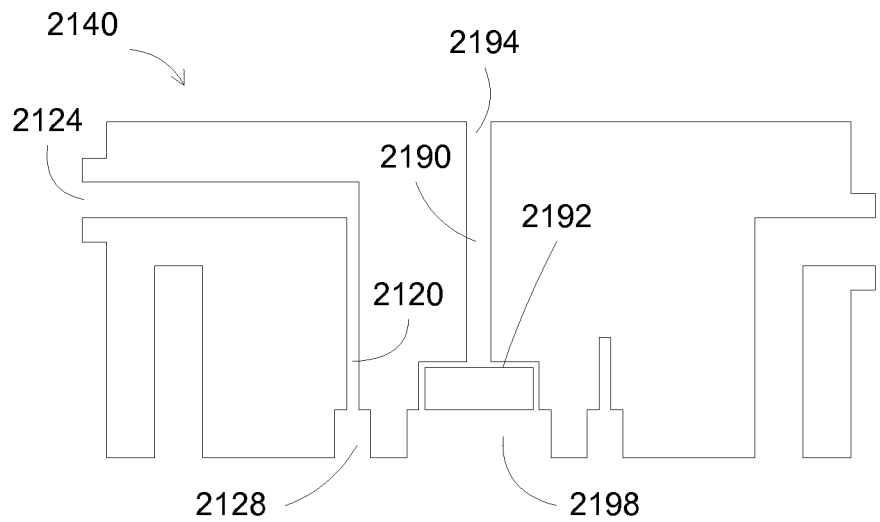
FIGS. 21A-21B illustrates another exemplary protective chuck according to some embodiments of the present invention.
Figure 21B:
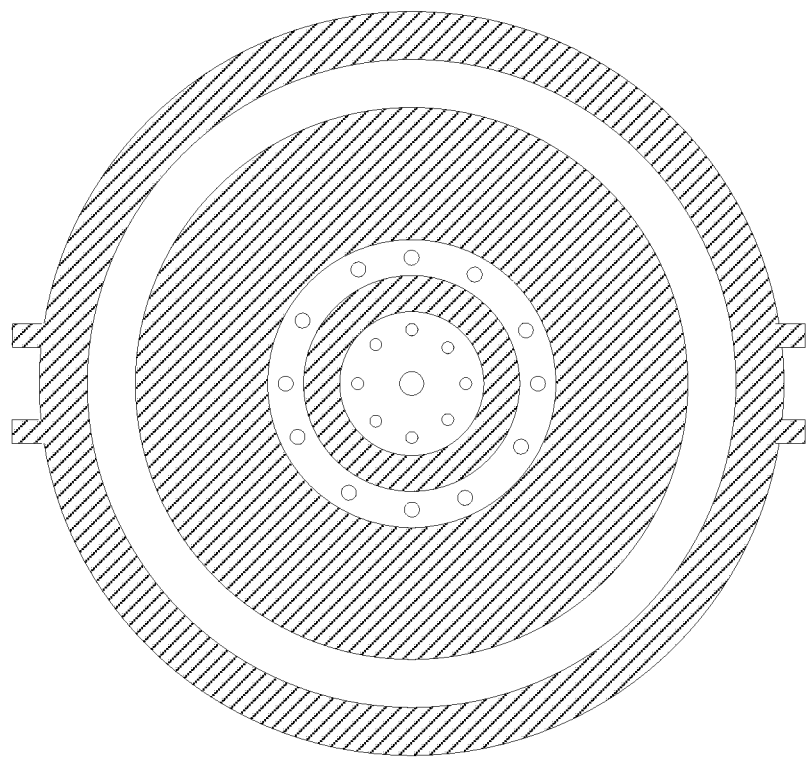

FIGS. 21A-21B illustrates another exemplary protective chuck according to some embodiments of the present invention. FIG. 21A shows a cross section side view and FIG. 21B shows a bottom view of the protective chuck 2140. Protective chuck 2140 has a gas conduit 2190 coupled to an inlet 2194, and terminated at a recess 2198 with multiple outlets 2192. The recess 2198 is disposed at a center of the bottom surface. Multiple outlets 2192 can be distributed at the recess 2198, controlling the uniformity of the gas flow along the bottom surface of the chuck. Protective chuck 2140 further has a liquid conduit 2120 coupled to an inlet 2124, and terminated at a recess 2128. The recess 2128 is disposed at a ring surrounding the center conduit, comprising multiple outlets distributed along the periphery of the recess 2028, controlling the uniformity of the fluid flow along the bottom surface of the chuck.

Figure 22A:
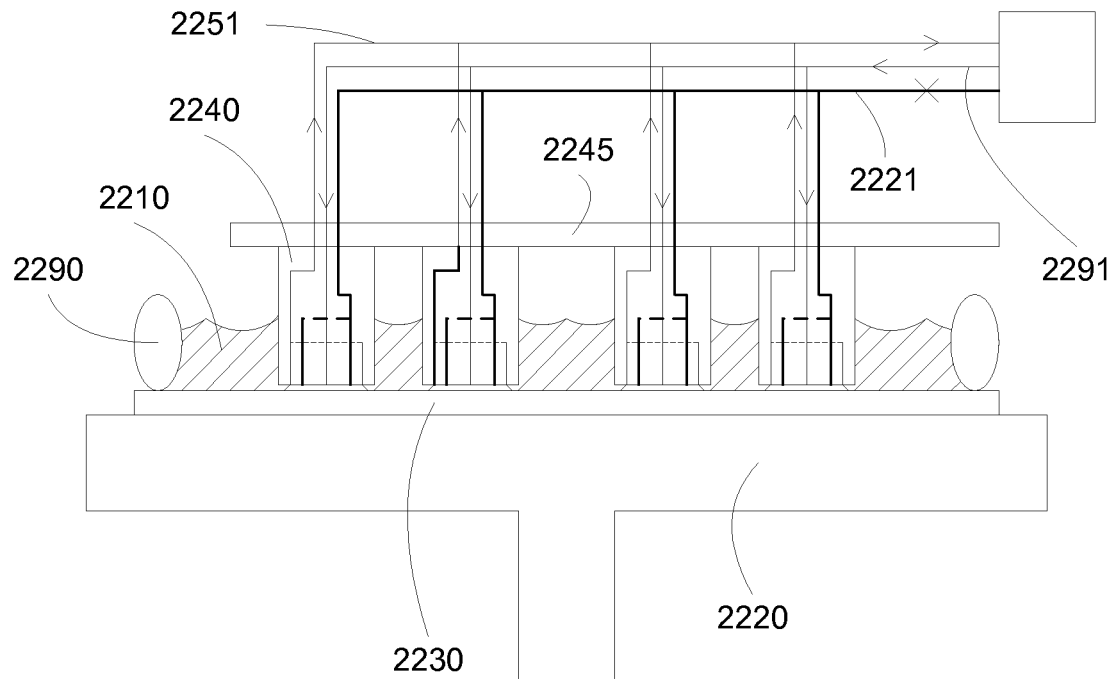
FIGS. 22A-22D illustrate an exemplary method for processing a substrate in a high productivity combinatorial system according to some embodiments of the present invention.

FIGS. 22A-22D illustrate an exemplary method for processing a substrate in a high productivity combinatorial system according to some embodiments of the present invention. In FIG. 22A, a chamber, for example, a processing chamber within a high productivity combinatorial system, comprises a substrate support 2220. A substrate 2230 can be brought to the process chamber, and disposed on the substrate support 2220. A plurality of reactors 2240, for example, from a reactor assembly 2245, is lowered to the substrate surface, forming multiple site isolation regions 2237. Gas flowing 2291 to the reactors 2240 and exhausting 2251 can pressurize the air gap, forming a gas layer under the reactors 2240. Processing fluid 2210, such as an etching solution of a cleaning solution, can be introduced to the remaining substrate surface 2234, outside the site isolated regions 2237 defined by gas layer under the reactors 2240. The fluid is bounded by a fluid blocking element, such as an o-ring 2290, to contain the fluid within the substrate surface. The gas layer under the reactors 2240 is pressurized, preventing the fluid from entering the regions of the gas layer. The processing of the fluid is then restricted to the substrate surface outside the reactor areas, with the gas layer protecting the surface areas under the reactors.

Figure 22B:
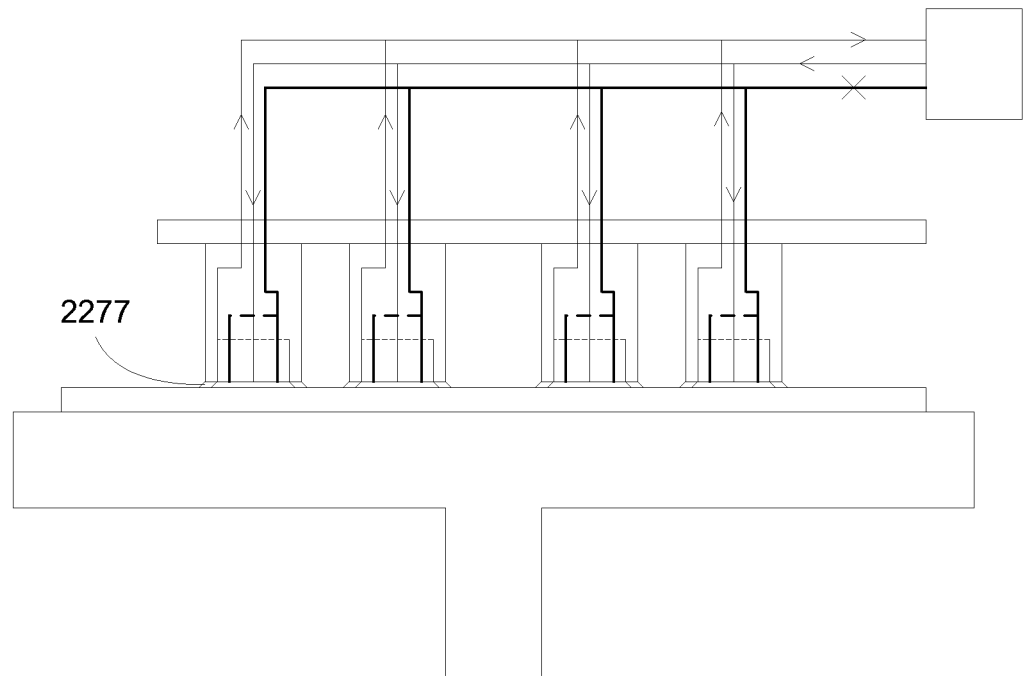
Figure 22C:
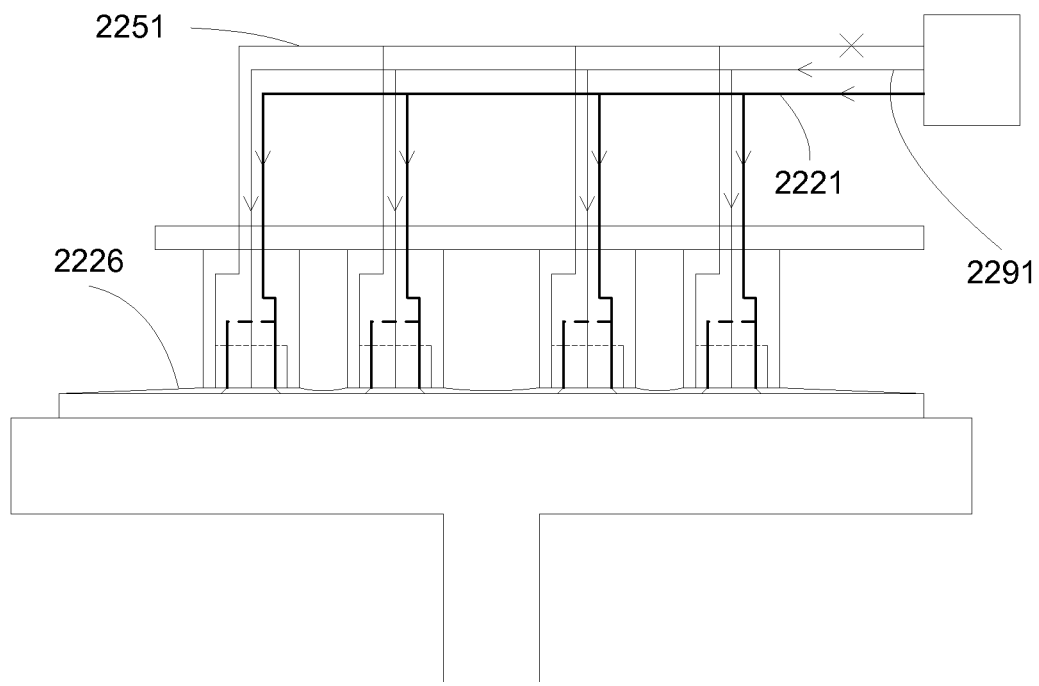
Figure 22D:
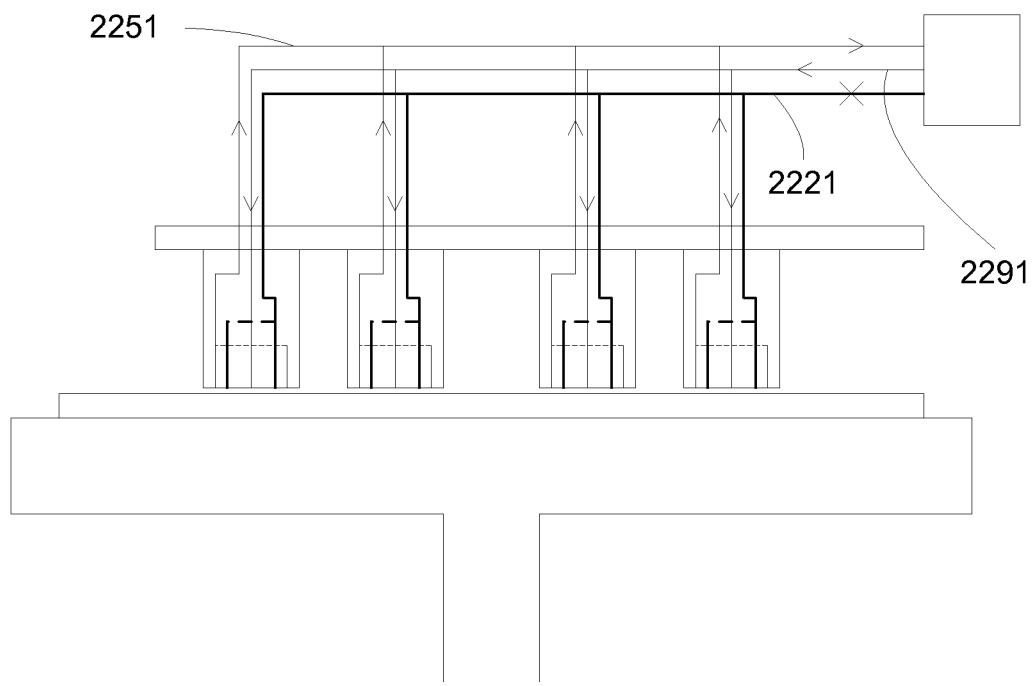

In FIG. 22B, the processing liquid 2210 is removed, leaving residues 2277 under the reactor 2240. In FIG. 22C, exhaust line 2251 is blocked, and liquid line 2221 is opened. Rinsing liquid 2226 provided through the liquid line 2221 flows under the reactor 2240, cleaning out the residues. In FIG. 22D, exhaust line 2251 is opened, and liquid line 2221 is close. The residues have been rinsed and cleaned.

Figure 23:
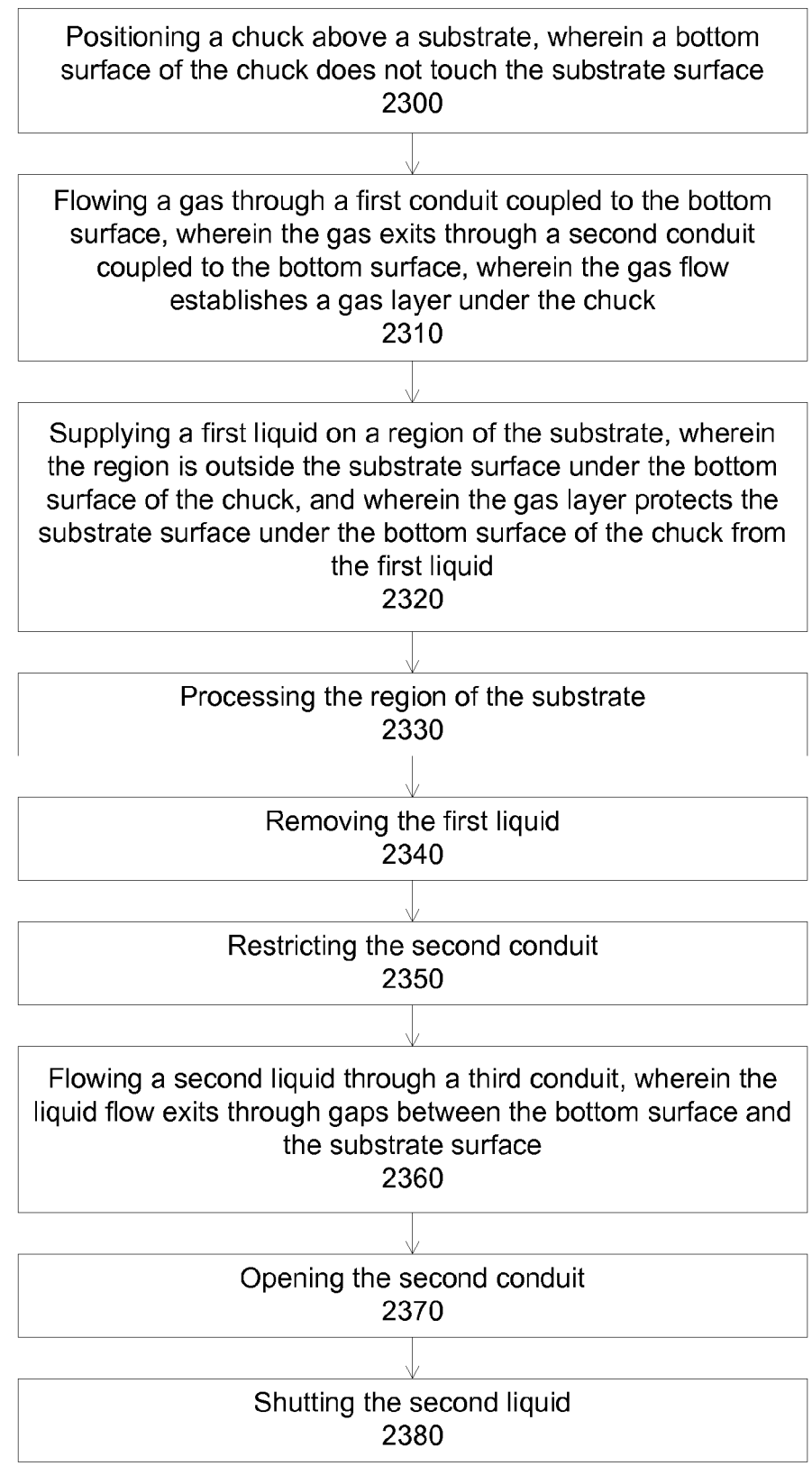
FIG. 23 illustrates an exemplary flowchart for rinsing a substrate using a protective chuck according to some embodiments of the present invention.

FIG. 23 illustrates an exemplary flowchart for rinsing a substrate using a protective chuck according to some embodiments of the present invention. In operation 2300, a chuck is positioned above a substrate, wherein a bottom surface of the chuck does not touch the substrate surface. In operation 2310, a gas is flowed through a first conduit coupled to the bottom surface, wherein the gas exits through a second conduit coupled to the bottom surface, wherein the gas flow establishes a gas layer under the chuck.

In operation 2320, a first liquid is supplied on a region of the substrate, wherein the region is outside the substrate surface under the bottom surface of the chuck, and wherein the gas layer protects the substrate surface under the bottom surface of the chuck from the first liquid. The gas pressure of the gas bearing layer can prevent the fluid from entering the protected region.

In operation 2330, the region of the substrate outside the areas of the protective chuck is processed. In operation 2340, the first liquid is removed. In operation 2350, the second conduit is restricted, either fully or partially. In operation 2360, a second liquid is flowed through a third conduit, wherein the liquid flow exits through gaps between the bottom surface of the chuck and the substrate surface, in addition to through the second conduit, if the second conduit is partially restricted. In some embodiments, the conduits are coupled to a manifold, with a switching valve for switching between open and close positions. During a first phase of processing, the switching valve is close to shut off the liquid outlet. During the second phase of liquid rinsing, the switching valve is open to provide the rinsing liquid, flowing to the inside of the bottom surface of the chuck for cleaning and rinsing any liquid residues.

In operation 2370, the second conduit is restricted, either fully or partially. In operation 2380, the liquid flow is terminated, for example, by restricting or closing the third conduit.

Figure 24:
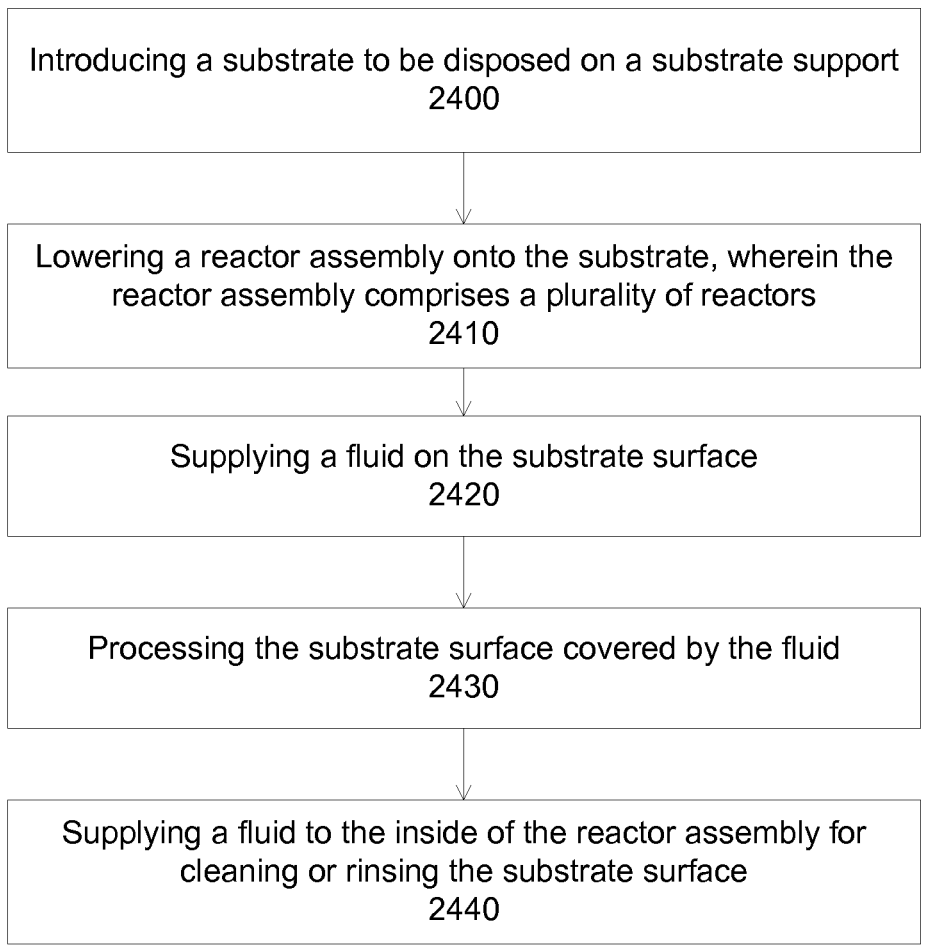
FIG. 24 illustrates an exemplary flowchart for processing a substrate in a high productivity combinatorial system according to some embodiments of the present invention.

FIG. 24 illustrates an exemplary flowchart for processing a substrate in a high productivity combinatorial system according to some embodiments of the present invention. Operation 2400 introduces a substrate to be disposed on a substrate support of a process chamber, for example, a processing chamber within a high productivity combinatorial system. The substrate might be needed to have certain surface areas processed, such as etching or cleaning. For example, the substrate can be deposited with a conductive layer in multiple site isolated regions, and requiring the removal of the deposited conductive layer at the substrate areas outside the site isolated regions to prevent electrical shortage between the site isolated regions.

Operation 2410 lowers a reactor assembly onto the substrate, wherein the reactor assembly comprises a plurality of reactors. The reactor assembly then forms multiple site isolation regions on the substrate surface. For example, the reactors can be positioned on existing site isolated regions on the substrate, covering these regions under the reactors. The reactors can form touchless site isolation regions, having a gap with the substrate surface to prevent particle generation due to contact friction. Gas flowing to the reactors can pressurize the air gap, forming a gas layer under the reactors.

Operation 2420 supplies a fluid on the substrate surface. The fluid is preferably a processing fluid, such as an etching solution of a cleaning solution, is introduced to the remaining substrate surface, outside the site isolated regions defined by gas layer under the reactors. An o-ring can be disposed around the substrate to confine the processing fluid within the substrate surface. Since the gas layer under the reactors is pressurized, the fluid is prevented from entering the site isolated regions under the reactor bottom surface, and is disposed only on the remaining substrate surface, e.g., the area outside the site isolated regions defined by the reactors.

In operation 2430, the remaining substrate surface is processed by the fluid. After processing, the processing liquid is removed, for example, by aspiration or by draining. Residues might remains under the reactors, especially under the gaps between the reactor surface and the substrate surface.

Operation 2440 supplies a fluid to the inside of the reactor assembly for cleaning or rinsing the remaining substrate surface. For example, rinsing liquid can be provided through liquid lines to the reactors, flowing outward to the remaining substrate surface from under the reactor surface, cleaning out the residues. After the residues have been rinsed and cleaned, the rinsing liquid flow is stopped, and any rinsing liquid on the substrate surface can be removed or dried. The substrate is then ready to be transferred to another processing chamber for a subsequent process.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A chuck comprising
  a bottom surface;
  a first conduit, wherein the first conduit comprises a first outlet disposed on the bottom surface;
  a second conduit, wherein the second conduit is coupled to a liquid source, wherein the second conduit comprises multiple second outlets disposed on the bottom surface, and wherein the multiple second outlets surround the first outlet; and
  a third conduit, wherein the third conduit comprises an inlet disposed on the bottom surface, and wherein the inlet surrounds the multiple second outlets.

2. A chuck as in claim 1 wherein the first conduit comprises a plurality of outlets disposed in a periphery of a recessed area of the bottom surface.

3. A chuck as in claim 1 wherein the multiple second outlets are disposed in a recessed ring surrounding a periphery of the bottom surface.

4. A chuck as in claim 1 further comprising a restricting valve coupled to the third conduit to regulate a flow resistance of the third conduit.

5. A chuck as in claim 1 further comprising a valve coupled to the third conduit to isolate the third conduit.

6. A chuck as in claim 1 further comprising a valve coupled to the second conduit to isolate the second conduit.

7. A chuck as in claim 1 wherein the first conduit is coupled to a gas source.

8. A combinatorial processing system comprising a plurality of chucks, each chuck comprising
  a bottom surface;
  a first conduit, wherein the first conduit comprises a first outlet disposed on the bottom surface;
  a second conduit, wherein the second conduit comprises multiple second outlets disposed on the bottom surface, and wherein the multiple second outlets surround the first outlet;
  a liquid flow controller coupled to the second conduit to regulate a liquid flow through the second conduit:
  a third conduit, wherein the third conduit comprises a inlet disposed on the bottom surface, and wherein the inlet surrounds the multiple second outlets; and
  a substrate support, wherein the surface of the substrate support is parallel to the bottom surfaces of the chucks.

9. A system as in claim 8 further comprising a gas flow controller coupled to the first conduit to regulate a gas flow through the first conduit.

10. A system as in claim 8 further comprising a restricting valve coupled to the third conduit to regulate a flow resistance of the third conduit.

11. A system as in claim 8 further comprising a controller to regulate the gas flow through the first conduit.

* * * * *